United States Patent
Kishino et al.

(10) Patent No.: US 9,647,633 B2
(45) Date of Patent: May 9, 2017

(54) ACOUSTIC WAVE ELEMENT, BRANCHING FILTER AND COMMUNICATION MODULE

(71) Applicant: KYOCERA Corporation, Fushimi-ku, Kyoto-shi, Kyoto (JP)

(72) Inventors: Tetsuya Kishino, Kyoto (JP); Tsuyoshi Nakai, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 260 days.

(21) Appl. No.: 14/397,169

(22) PCT Filed: Apr. 24, 2013

(86) PCT No.: PCT/JP2013/062085
§ 371 (c)(1),
(2) Date: Oct. 24, 2014

(87) PCT Pub. No.: WO2013/161881
PCT Pub. Date: Oct. 31, 2013

(65) Prior Publication Data
US 2015/0070227 A1 Mar. 12, 2015

(30) Foreign Application Priority Data

Apr. 25, 2012 (JP) .................. 2012-100225
Dec. 28, 2012 (JP) .................. 2012-287280

(51) Int. Cl.
*H03H 9/145* (2006.01)
*H03H 9/02* (2006.01)
(Continued)

(52) U.S. Cl.
CPC ....... *H03H 9/02992* (2013.01); *H01L 41/047* (2013.01); *H03H 9/02818* (2013.01);
(Continued)

(58) Field of Classification Search
CPC ........ H03H 9/009; H03H 9/725; H03H 9/576; H03H 9/0542; H03H 9/02818;
(Continued)

(56) References Cited

U.S. PATENT DOCUMENTS

2005/0046520 A1* 3/2005 Nishizawa ........... H03H 9/6483
333/195
2007/0030096 A1 2/2007 Nishihara et al.
(Continued)

FOREIGN PATENT DOCUMENTS

JP 5-22074 A 1/1993
JP 05-167384 A 7/1993
(Continued)

OTHER PUBLICATIONS

International search report dated Jul. 2, 2013 issued for International Application No. PCT/JP2013/062085.
(Continued)

*Primary Examiner* — J. San Martin
(74) *Attorney, Agent, or Firm* — Procopio, Cory, Hargreaves & Savitch LLP

(57) ABSTRACT

SAW element has a substrate; an IDT having a first comb-shaped electrode and a second comb-shaped electrode located on an upper surface of the substrate; and a capacitance element located on the upper surface of the substrate. The capacitance element has a first counter electrode connected to the first comb-shaped electrode and a second counter electrode connected to the second comb-shaped electrode and facing the first counter electrode across a third gaps. The direction from the first counter electrode through the third gaps toward the second counter electrode is a reverse direction from the direction from the first comb-shaped electrode through the gaps toward the second comb-shaped electrode. If it is assumed that the gap and width of
(Continued)

the gap are $d_i$ and $w_i$, and the gap and width of the third gap are $D_j$ and $W_j$, the following formula holds:

$$0<\Sigma(W_j/D_j^2)<2\Sigma(w_i/d_i^2).$$

11 Claims, 15 Drawing Sheets

(51) Int. Cl.
    *H03H 9/72*      (2006.01)
    *H01L 41/047*    (2006.01)
    *H03H 9/05*      (2006.01)
    *H03H 9/00*      (2006.01)
(52) U.S. Cl.
    CPC ........ *H03H 9/0542* (2013.01); *H03H 9/0576* (2013.01); *H03H 9/725* (2013.01); *H03H 9/0009* (2013.01); *H03H 9/0038* (2013.01); *H03H 9/1452* (2013.01); *H03H 9/14544* (2013.01); *H03H 9/14573* (2013.01)
(58) Field of Classification Search
    CPC ............. H03H 9/02992; H03H 9/1452; H03H 9/14544; H03H 9/14573
    USPC .......................................... 310/313 R, 313 D
    See application file for complete search history.

(56) References Cited

U.S. PATENT DOCUMENTS

| | | |
|---|---|---|
| 2008/0129418 A1 | 6/2008 | Miura et al. |
| 2013/0021116 A1 | 1/2013 | Sogoya et al. |
| 2013/0154763 A1 | 6/2013 | Takamine |

FOREIGN PATENT DOCUMENTS

| | | | |
|---|---|---|---|
| JP | 9-167937 A | 6/1997 | |
| JP | 2007-074698 A | 3/2007 | |
| JP | 2008-109413 A | 5/2008 | |
| JP | WO 2016088804 A1 * | 6/2016 | ............ H03H 9/145 |
| WO | 2011-142143 A1 | 11/2011 | |
| WO | 2012/032832 A1 | 3/2012 | |

OTHER PUBLICATIONS

Office Action dated Sep. 20, 2016 issued by the Japanese Patent Office in Japanese Patent Application No. 2013-241679.

* cited by examiner

ACOUSTIC WAVE ELEMENT, BRANCHING FILTER AND COMMUNICATION MODULE

TECHNICAL FIELD

The present invention relates to an acoustic wave element such as a surface acoustic wave (SAW) element, a branching filter, and a communication module.

BACKGROUND ART

There is known an acoustic wave element having a piezoelectric substrate and an IDT (InterDigital Transducer) provided on a major surface of the piezoelectric substrate. Such an acoustic wave element is utilized in for example a transmitting filter, receiving filter, or the like of a branching filter.

In an acoustic wave element, the electrical characteristics sometimes fall due to an electrical distorted wave generated due to nonlinearity of the element. For example, in a branching filter using an acoustic wave element, an interfering wave which is out of the transmission band and reception band and a transmission wave are mixed to cause a distorted wave contained in the reception band. This distorted wave is called inter-modulation distortion (IMD) and is one of the causes of a drop in the quality of communication (SN ratio) of a wireless communication apparatus. Other than this, harmonic distortion having a frequency which is a whole multiple of the transmission wave is generated. There is also a possibility of obstruction of communication of another wireless communication apparatus or another problem by this.

Therefore, for suppressing the drop of the SN ratio due to the distorted wave, there is known a method of dividing a serial resonator or parallel resonator of a ladder type filter which configures the branching filter without a change of electrostatic capacity (for example Patent Literature 1). This is to divide the serial resonator or parallel resonator and thereby disperse the voltage applied to the resonator to suppress the distorted wave.

Note that, although not a citation relating to the art of suppressing the distorted wave, Patent Literature 2 discloses a capacitance element which is provided on a major surface of a piezoelectric substrate and is connected parallel to an IDT.

However, when dividing a resonator without a change of electrostatic capacity, compared with that before division, the resonator becomes larger in size and consequently the acoustic wave element becomes larger in size.

CITATION LIST

Patent Literature

Patent Literature 1: Japanese Patent Publication No. 2007-074698A
Patent Literature 2: Japanese Patent Publication No. 5-167384A Accordingly, desirably there are provided an acoustic wave element, a branching filter, and a communication module which are capable of suppressing influence of a distorted wave more suitably.

SUMMARY OF INVENTION

An acoustic wave element according to one aspect of the present invention has a piezoelectric substrate; an IDT having a first comb-shaped electrode and a second comb-shaped electrode which are located on an upper surface of the piezoelectric substrate; and a single capacitance element which is located on the upper surface of the piezoelectric substrate and is electrically connected to the IDT. The first comb-shaped electrode has a first bus bar and a plurality of first electrode fingers extending from the first bus bar. The second comb-shaped electrode has a second bus bar and a plurality of second electrode fingers extending from the second bus bar. In the first comb-shaped electrode and the second comb-shaped electrode, the plurality of first electrode fingers and the plurality of second electrode fingers mesh with each other. The first electrode fingers have tips facing the second comb-shaped electrode across first gaps in their extending direction. The second electrode fingers have tips facing the first comb-shaped electrode across second gaps in their extending direction. The capacitance element has a first counter electrode which is connected to the first comb-shaped electrode and a second counter electrode which is connected to the second comb-shaped electrode and faces the first counter electrode across a third gap. The direction from the first counter electrode through the third gap toward the second counter electrode is a reverse direction from the direction from the first comb-shaped electrode through the first gaps toward the second comb-shaped electrode and from the direction from the first comb-shaped electrode through the second gaps toward the second comb-shaped electrode. A length D and width L of the third gap satisfy the following formula (A) where the total number of the first gaps and the second gaps is n (n≥2), and lengths and widths of the i-th first gap and second gap among the first gaps and the second gaps which are counted in order from one end of the IDT are $d_i$ and $w_i$ (1≤i≤n):

$$0 < \frac{L}{D^2} < 2 \sum_{i=1}^{n} \frac{w_i}{d_i^2} \quad (A)$$

An acoustic wave element according to one aspect of the present invention has a piezoelectric substrate; an IDT having a first comb-shaped electrode and a second comb-shaped electrode which are located on an upper surface of the piezoelectric substrate; and two or more capacitance elements which are located on the upper surface of the piezoelectric substrate and are electrically connected to the IDT. The first comb-shaped electrode has a first bus bar and a plurality of first electrode fingers extending from the first bus bar. The second comb-shaped electrode has a second bus bar and a plurality of second electrode fingers extending from the second bus bar. In the first comb-shaped electrode and the second comb-shaped electrode, the plurality of first electrode fingers and the plurality of second electrode fingers mesh with each other. The first electrode fingers have tips facing the second comb-shaped electrode across first gaps in their extending direction. The second electrode fingers have tips facing the first comb-shaped electrode across second gaps in their extending direction. The capacitance elements have two or more first counter electrodes which are connected to the first comb-shaped electrode and two or more second counter electrodes which are connected to the second comb-shaped electrode and face the first counter electrodes across third gaps. The direction from the first counter electrodes through the third gaps toward the second counter electrodes is a reverse direction from the direction from the first comb-shaped electrode through the first gaps toward the second comb-shaped electrode and from the direction from the first comb-shaped electrode through the second gaps toward the second comb-shaped electrode. The capacitance elements satisfy the following formula (D) where the total number of the first gaps and the second gaps is n (n≥2), lengths and widths of the i-th first gap and second gap among the first gaps and the second gaps which are counted in order from one end of the IDT are $d_i$ and $w_i$ (1≤i≤n), the total number of the third gaps is m (m≥2), and the length and width of the j-th third gap are $D_j$ and $W_j$ (1≤j≤m):

$$0 < \sum_{j=1}^{m} \frac{W_j}{D_j^2} < 2 \sum_{i=1}^{n} \frac{w_i}{d_i^2} \tag{D}$$

An acoustic wave element according to one aspect of the present invention has a piezoelectric substrate; an IDT having a first comb-shaped electrode and a second comb-shaped electrode which are located on an upper surface of the piezoelectric substrate; and a pair of reflectors which are located on the upper surface of the piezoelectric substrate so as to sandwich the IDT therebetween. The first comb-shaped electrode has a first bus bar and a plurality of first electrode fingers extending from the first bus bar. The second comb-shaped electrode has a second bus bar and a plurality of second electrode fingers extending from the second bus bar. In the first comb-shaped electrode and the second comb-shaped electrode, the plurality of first electrode fingers and the plurality of second electrode fingers mesh with each other. The first electrode fingers have tips facing the second comb-shaped electrode across first gaps in their extending direction. The second electrode fingers have tips facing the first comb-shaped electrode across second gaps in their extending direction. The reflector have first counter electrodes which are connected to the first comb-shaped electrode and second counter electrodes which are connected to the second comb-shaped electrode and face the first counter electrodes. One electrodes of the first counter electrodes and the second counter electrodes have a plurality of third electrode fingers which extend toward the other electrodes of the first counter electrodes and the second counter electrodes and have tips facing the other electrodes across the third gaps in their extending direction. The direction from the first counter electrodes across the third gaps toward the second counter electrodes is a reverse direction from the direction from the first comb-shaped electrode through the first gaps toward the second comb-shaped electrode and from the direction from the first comb-shaped electrode through the second gaps toward the second comb-shaped electrode.

A branching filter according to one aspect of the present invention has an antenna terminal, a transmitting filter which filters transmission signals and outputs the result to the antenna, and a receiving filter which filters a reception signal from the antenna. The transmitting filter has any of the above acoustic wave elements.

A communication module according to one aspect of the present invention has an antenna, the above branching filter which is electrically connected to the antenna, and an RF-IC which is electrically connected to the branching filter.

According to the above configurations, the influence of a distorted wave can be suppressed.

DESCRIPTION OF EMBODIMENTS

Figure 1:
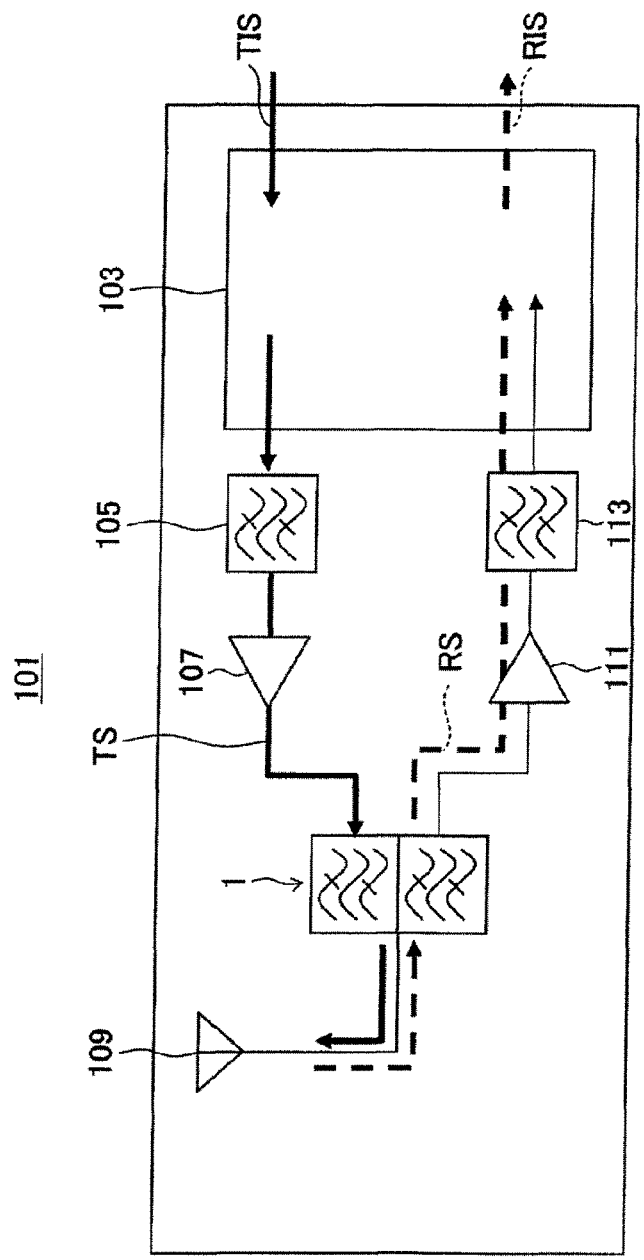
FIG. 1 A block diagram which shows the configuration of a signal processing system of a communication module including a branching filter according to a first embodiment of the present invention.

Below, an explanation will be given of SAW elements and a branching filter according to embodiments of the present invention with reference to the drawings. Note that, the diagrams used in the following explanation are schematic ones, and dimension, ratios, etc. in the drawings do not always coincide with the actual ones.

In the second and following embodiments, the same configurations or similar configurations as the configurations of the already explained embodiments will be assigned the same notations as those in the already explained embodiments and explanations thereof will sometimes be omitted.

First Embodiment

Communication Module

FIG. 1 is a block diagram which shows principal parts of an example of utilization (communication module 101) of a branching filter 1 (duplexer) according to a first embodiment of the present invention. The communication module 101 performs wireless communication utilizing radio waves. The branching filter 1 has the function of separating a signal of a transmission frequency and a signal of a reception frequency in the communication module 101.

In the communication module 101, a transmission information signal TIS containing information to be transmitted is modulated and raised in the frequency (converted to a high frequency signal having a carrier frequency) by the RF-IC 103 to obtain a transmission signal TS. The transmission signal TS is stripped of unnecessary components outside of the transmission-use passband by a band pass filter 105, amplified by an amplifier 107, and input to the branching filter 1. Further, the branching filter 1 strips the unnecessary components outside of the transmission-use passband from the input transmission signal TS and outputs the result to the antenna 109. The antenna 109 converts the input electrical signal (transmission signal TS) to a wireless signal (radio wave) and transmits the same.

Further, in the communication module 101, the wireless signal (radio wave) which is received by the antenna 109 is converted to an electrical signal (reception signal RS) by the antenna 109 and is input to the branching filter 1. The branching filter 1 strips unnecessary components outside of the reception-use passband from the input reception signal RS and outputs the result to the amplifier 111. The output reception signal RS is amplified by the amplifier 111 and is stripped of the unnecessary components outside of the reception-use passband by a band pass filter 113. Further, the reception signal RS is lowered in frequency and demodulated by the RF-IC 103 to obtain a reception information signal RIS.

Note that, the transmission information signal TIS and the reception information signal RIS may be low frequency signals (baseband signals) containing suitable information and are for example analog audio signals or digital audio signals. The passband of the wireless signal may be one according to the UMTS (Universal Mobile Telecommunications System) or other various standards. The modulation scheme may be either phase modulation, amplitude modulation, frequency modulation, or a combination of any two or more among them. As the circuit system, FIG. 1 exemplified a direct conversion system, but may be a suitable one other than this as well. For example, it may be a double super-heterodyne system as well. Further, FIG. 1 schematically shows only principal parts. A low pass filter or isolator etc. may be added to a suitable position or the positions of the amplifiers etc. may be changed.

(Branching Filter)

Figure 2:
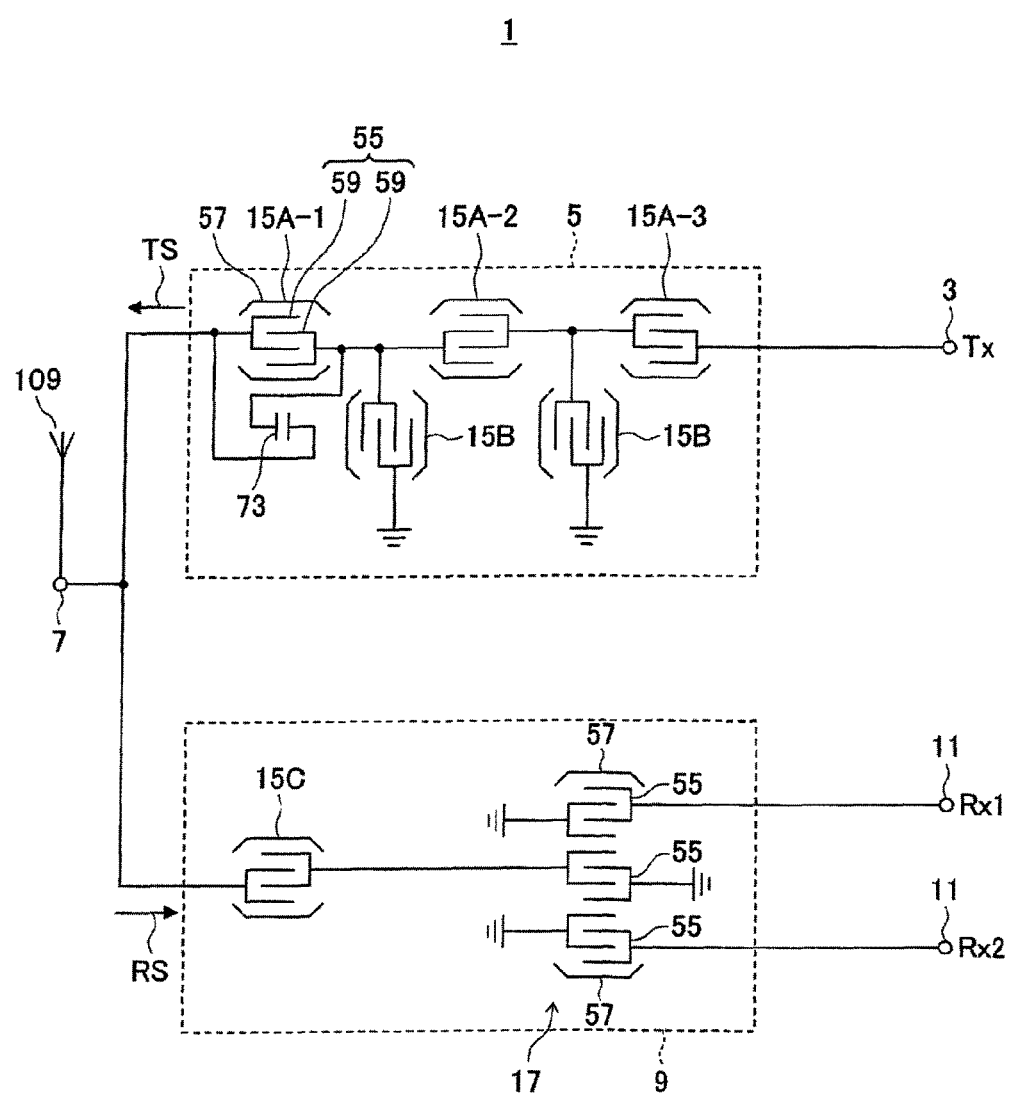
FIG. 2 A circuit diagram which shows the configuration of the branching filter in FIG. 1.

FIG. 2 is a circuit diagram which shows the configuration of the branching filter 1.

The branching filter 1 has a transmission terminal 3 receiving as input the transmission signal TS from the amplifier 107, a transmitting filter 5 which strips unnecessary components outside of the transmission-use passband from the transmission signal TS and outputs the result, and an antenna terminal 7 which receives as input the signal from the transmission filter 5. The antenna terminal 7 is connected to the antenna 109.

Further, the branching filter 1 has a receiving filter 9 which strips the unnecessary components outside of the reception-use passband from the reception signal RS input through the antenna terminal 7 from the antenna 109 and outputs the result and reception terminals 11 which receive as input the signals from the receiving filter 9. The reception terminals 11 are connected to the amplifier 111.

The transmitting filter 5 is configured by for example a ladder type SAW filter. That is, the transmitting filter 5 has at least one (three in the present embodiment) first serial resonator 15A-1 to third serial resonator 15A-3 which are connected in series between the input side and the output side of that and one or more (two in the present embodiment) parallel resonators 15B which are provided between that serial line and a reference potential part. Note that, in the following description, the first serial resonator 15A-1 to the third serial resonator 15A-3 will be sometimes simply referred to as the "serial resonators 15A" and will not be discriminated. Further, the serial resonator 15A and the parallel resonator 15B will be sometimes simply referred to as the "resonators 15" and will not be distinguished.

The first serial resonator 15A-1 is the resonator 15 which is nearest the antenna terminal 7 in the transmitting filter 5. Further, a circuit for impedance matching may be inserted among the transmitting filter 5, receiving filter 9, and antenna terminal 7 as well.

The receiving filter 9 has for example a multi-mode type SAW filter 17 and an auxiliary resonator 15C (which will be sometimes simply referred to as the "resonator 15") connected in series to the input side of that. Note that, in the present embodiment, the multiple mode includes a duplex mode.

(SAW Element)

Figure 3:
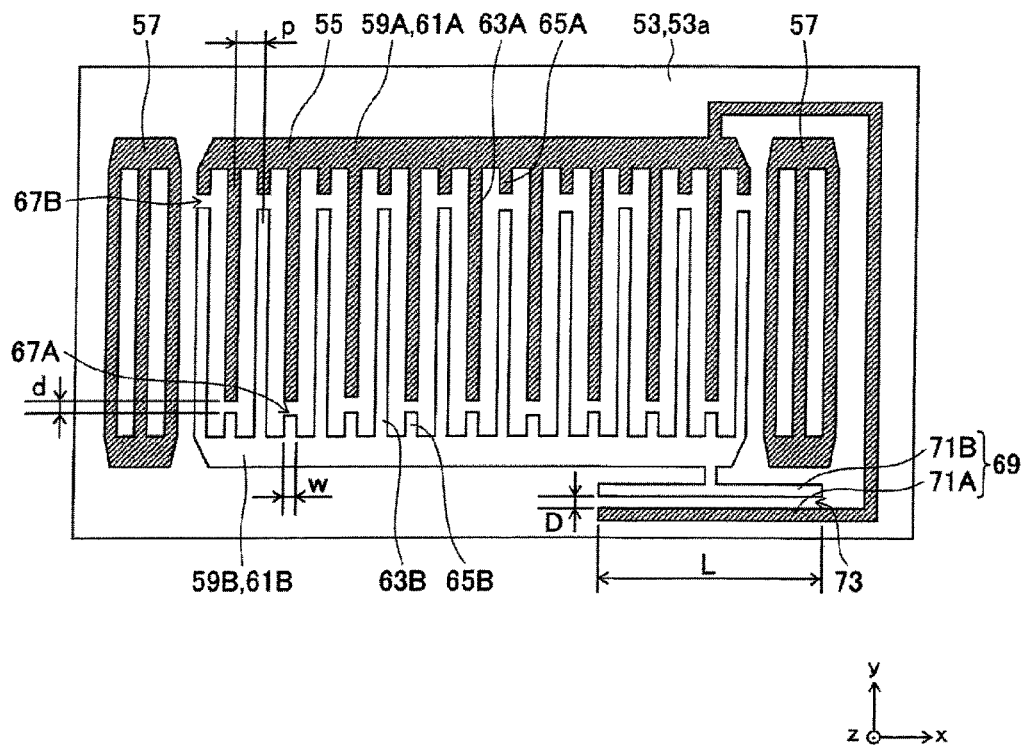
FIG. 3 A plan view which shows a SAW element configuring a serial resonator of the branching filter in FIG. 2.

FIG. 3 is a plan view which shows the configuration of a SAW element 51 configuring the first serial resonator 15A-1.

Note that, in the SAW element 51, any direction may be made upward or downward. However, in the following description, for convenience, an orthogonal coordinate system xyz is defined, and use is made of an "upper surface", "lower surface", and other terms where the positive side of the z-direction (this side on the drawing sheet in FIG. 3) is the upper part.

The SAW element 51 is configured as for example a 1 port SAW resonator and has a substrate 53 and an IDT 55 and reflectors 57 which are provided on an upper surface 53a of the substrate 53. Note that, the SAW element 51 has, other than the parts described above, an added film which is arranged on the upper surfaces of the IDT 55 and reflectors 57, an adhesion layer which is interposed between the IDT 55 and reflectors 57 and the substrate 53, and a protective layer which covers the upper surface 53a of the substrate 53 over the IDT 55 and reflectors 57 (or added film) as well. Further, in FIG. 3, illustration of interconnects for input and output of the signal to and from the IDT 55 is omitted.

The substrate 53 is configured by a piezoelectric substrate. For example, the substrate 53 is configured by a substrate of a single crystal having piezoelectricity such as lithium niobate ($LiNbO_3$) single crystal. More suitably, the substrate 53 is configured by a 40°±10° Y-X cut $LiTaO_3$ substrate, 128°±10° Y-X cut $LiNbO_3$ substrate, or 0°±10° Y-X cut $LiNbO_3$ substrate. Other than this, use can be made of quartz ($SiO_2$) single crystal, and so on. A planar shape and various dimensions of the substrate 53 may be suitably set.

The IDT 55 is configured by a conductive pattern (conductive layer) formed on the upper surface 53a of the substrate 53 and has a first comb-shaped electrode 59A and second comb-shaped electrode 59B. Note that, in the following description, the first comb-shaped electrode 59A and second comb-shaped electrode 59B will be sometimes simply referred to as the "comb-shaped electrodes 59" and will not be distinguished. Further, for the configuration etc. concerned with the first comb-shaped electrode 59A, sometimes "first" and "A" will be attached like the "first bus bar 61A". For the configuration etc. relating to the second comb-shaped electrode 59B, sometimes "second" and "B" will be attached like the "second bus bar 61B", while sometimes "first", "second", "A", and "B" will be omitted.

The comb-shaped electrodes 59 have two bus bars 61 which face each other, a plurality of electrode fingers 63 which extend from the bus bars 61 to the other bus bar 61 sides, and a plurality of dummy electrodes 65 which extend from the bus bars 61 to the other bus bar 61 sides among the plurality of electrode fingers 63. Further, a pair of comb-shaped electrodes 59 are arranged so that their plurality of electrode fingers 63 mesh with (cross) each other.

Note that, the direction of propagation of the SAW is defined by the orientation etc. of the plurality of electrode fingers 63. However, in the present embodiment, for convenience, the orientation etc. of the plurality of electrode fingers 63 will be sometimes explained based on the direction of propagation of the SAW as the standard.

The bus bar 61 is for example roughly formed long in shape linearly extending in the direction of propagation of the SAW (x-direction) with a constant width. Further, a pair of bus bars 61 face each other in a direction (y-direction) crossing (perpendicular in the present embodiment) the direction of propagation of the SAW. Further, the pair of bus bars 61 are for example parallel to each other, and the distance between the pair of bus bars 61 is constant in the direction of propagation of the SAW.

The plurality of electrode fingers 63 are roughly formed long in shape linearly extending in a direction (y-direction) perpendicular to the direction of propagation of the SAW with a constant width and are arranged at roughly constant intervals in the direction of propagation of the SAW (x-direction). The plurality of electrode fingers 63 of the pair of comb-shaped electrodes 59 are provided so that their pitch "p" (for example a distance between the centers of the electrode fingers 63) becomes equal to a half wavelength of the wavelength λ of the SAW at the frequency to be resonated at. The wavelength λ is for example 1.5 μm to 6 μm.

The lengths (positions of the tips) of the plurality of electrode fingers 63 are for example made equal to each other. Further, the widths "w" of the plurality of electrode fingers 63 are for example made equal to each other. Note that, the dimensions may be suitably set in accordance with the electrical characteristics etc. demanded from the SAW element 51. For example, the width "w" is 0.4p to 0.7p for the pitch "p" of the plurality of electrode fingers 63.

The plurality of dummy electrodes 65 are roughly formed in a long shape linearly extending in a direction (y-direction) perpendicular to the direction of propagation of the SAW with a constant width and are arranged at the centers of spaces between the electrode fingers 63 (arranged with a pitch equal to that for the plurality of electrode fingers 63). Further, the tips of the dummy electrodes 65 of one comb-shaped electrode 59 face the tips of the electrode fingers 63 of the other comb-shaped electrode 59 across gaps 67 (first gaps 67A and second gaps 67B). The width (x-direction) of the dummy electrodes 65 is for example equal to the width "w" of the electrode fingers 63. The lengths (y-direction) of the plurality of dummy electrodes 65 are for example equal to each other.

The number of the plurality of gaps 67 is the same as the number of the plurality of electrode fingers 63. Further, the width "w" of the plurality of gaps 67 is the same as the width of the plurality of electrode fingers 63 and the width of the plurality of dummy electrodes 65. Further, the widths are equal to each other among the gaps 67. The lengths "d" of the plurality of gaps 67 (sizes in the y-direction. In the following description, the length of the gaps will be sometimes referred to as the "gap length") are the same as each other among the gaps 67. The gap length "d" may be suitably set in accordance with the electrical characteristics etc. demanded from the SAW element 51. For example, the gap length "d" is 0.1λ to 0.6λ.

The IDT 55 is for example formed by a metal. As this metal, for example there can be mentioned Al or an alloy containing Al as the principal ingredient (Al alloy). The Al alloy is for example an Al—Cu alloy. Note that, the IDT 55 may be configured by a plurality of metal layers as well. The thickness of the IDT 55 may be suitably set.

When voltage is applied to the substrate 53 by the IDT 55, a SAW which is propagated in the x-direction along the upper surface 53a of the substrate 53 is induced in the vicinity of the upper surface 53a. Further, the SAW is reflected by the electrode fingers 63. Further, a standing wave having the pitch "p" of the electrode fingers 63 as a half wavelength is formed. The standing wave is transformed to an electrical signal having the same frequency as that of the standing wave and is taken out by the electrode fingers 63. In this way, the SAW element 51 functions as a resonator or a filter.

The reflector 57 is configured by a conductive pattern (conductive layer) formed on the upper surface 53a of the substrate 53 and is formed in a lattice-state when viewed by a plan view. That is, the reflector 57 has a pair of bus bars (notations omitted) which face each other in a direction crossing the direction of propagation of the SAW and a plurality of electrode fingers (notations omitted) which extend in a direction (y) perpendicular to the direction of propagation of the SAW between these bus bars. The plurality of electrode fingers of the reflector 57 are arranged at a pitch which is roughly equal to that of the plurality of electrode fingers 63 of the IDT 55.

(Configuration for Suppressing Distorted Wave)

The SAW element 51 has a capacitance element 69 in addition to the basic configuration described above in order to suppress the influence of the distorted wave upon the SN ratio.

The capacitance element 69 is comprised of a conductive pattern (conductive layer) formed on the upper surface 53a of the substrate 53 and is a so-called gap type capacitor. Specifically, the capacitance element 69 has a first counter electrode 71A and a second counter electrode 71B which face each other. The counter electrodes 71 are for example roughly formed in long shapes linearly extending in the direction of propagation of the SAW (x-direction) with constant widths and face each other across a third gap 73 in a direction perpendicular to the direction of propagation of the SAW.

The first counter electrode 71A is connected to the first comb-shaped electrode 59A, while the second counter electrode 71B is connected to the second comb-shaped electrode 59B. On the other hand, the direction from the first counter electrode 71A to the second counter electrode 71B becomes reverse to the direction from the first comb-shaped electrode 59A to the second comb-shaped electrode 59B (the direction from the first electrode finger 63A through the first gaps 67A toward the second dummy electrodes 65B and the direction from the first dummy electrodes 65A through the second gaps 67B toward the second electrode fingers 63B).

The gap length D and width L of the third gap 73 are set so as to satisfy the following formula (1).

$$L/D^2 = (w \times n)/d^2 \qquad (1)$$

Here, "d" and "w" are the length and width of the gaps 67 as already explained, and "n" is the number of the gaps 67 in a pair of comb-shaped electrodes 59 (the total of the number of the first gaps 67A and the number of the second gaps 67B).

More specifically, in the present embodiment, by setting the gap length D and width L so as to satisfy the following formula (2) and formula (3), the above formula (1) is satisfied.

$$D=d \tag{2}$$

$$L=w \times n \tag{3}$$

Note that, in FIG. 3, the capacitance element 69 is positioned on the negative side of the y-direction with respect to the IDT 55 and reflectors 57, but may also be provided at a suitable position with respect to the IDT 55 and reflectors 57 such as the positive side of the y-direction, the positive side or negative side of the x-direction, and so on.

(Configuration of Other Resonators Etc.)

FIG. 2 schematically shows the IDT 55 and reflectors 57.

The configurations of the serial resonator 15A other than the first serial resonator 15A-1, the parallel resonator 15B, and the auxiliary resonator 15C are roughly the same as the first serial resonator 15A-1 (SAW element 51) except for the point that the capacitance element 69 is not provided in these resonators 15. Note that, in these resonators 15 as well, in the same way as the first serial resonator 15A-1, the capacitance element 69 may be provided as well.

The multi-mode type SAW filter 17 is, as schematically shown in FIG. 2, for example a longitudinally coupled one and has a plurality of (three in the present embodiment) DT's 55 which are arranged in the direction of propagation of the SAW and reflectors 57 which are arranged on the two sides of them. Further, the multi-mode type SAW filter 17 is for example an unbalanced input-balanced output type which converts an input unbalanced signal to a balanced signal and outputs the result.

The plurality of resonators 15 and multi-mode type SAW filter 17 are for example provided together on the upper surface 53a of one substrate 53, while the propagation directions of SAW are the same as each other. Note that, FIG. 2 is a circuit diagram, therefore the resonators 15 etc. are shown without unifying the direction of propagation of the SAW.

Figure 4:
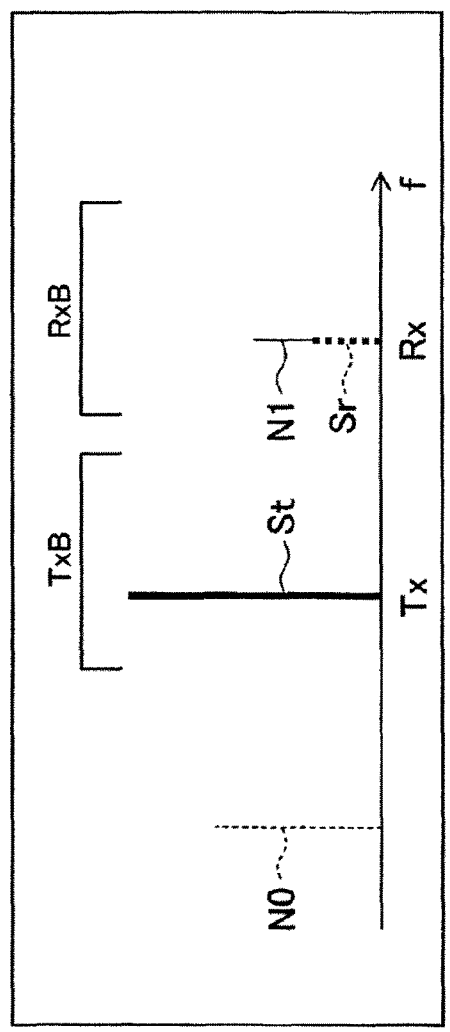
FIG. 4 A diagram for explaining the mode of operation of the branching filter in FIG. 2.

FIG. 4 is a diagram for explaining the mode of operation of the branching filter 1. In this diagram, an abscissa shows the frequency "f", and an ordinate shows the signal strength.

The transmission signal TS (line St) and reception signal RS (line Sr) are signals having high signal strengths at the predetermined frequencies contained in the transmission frequency band T×B and reception frequency band R×B. Here, it is assumed that a disturbing signal (line N0) is generated out of these bands. This disturbing signal itself is attenuated by the receiving filter 9 and is not received by the RF-IC 103. However, sometimes the disturbing signal and the transmission signal TS are mixed and a distorted signal (line N1) is generated. Further, when the frequency of that distorted signal is equal to the frequency of the reception signal RS, the distorted signal is not attenuated by the receiving filter 9 and is received by the RF-IC 103.

The distorted signal is generated due to the nonlinearity of the piezoelectric characteristic on the substrate 53. Specifically, this is as follows.

In a case where the deformation S (mechanical distortion) and electric field E in the piezoelectric material are relatively small, the piezoelectric characteristic is linear, therefore the piezoelectric constitutive equation is expressed by the following formula (4).

$$T=cS-eE \tag{4}$$

Here, T is the stress, "c" is the elastic constant, and "e" is the piezoelectric constant.

However, when the deformation S and electric field E are large, the amount of deformation (S) becomes saturated with respect to the stress T, therefore the piezoelectric constitutive equation becomes nonlinear as shown by the following formula (5).

$$T=cS+c_2S^2+c_3S^3 \ldots -eE-e_2E^2-e_3E^3 \ldots \tag{5}$$

Here, $c_2S^2+c_3S^3 \ldots$ and $-e_2E^2-e_3E^3 \ldots$ are non-linear terms.

Assuming that $E_1 \sin(\omega_1 t)+E_2 \sin(\omega_2 t)$ is input to the piezoelectric material as the electric field E, formula (4) in the case where the piezoelectric characteristic is linear becomes like the following formula (6). Note that, for simplicity, the effect of the deformation S is omitted.

$$T=-eE_1 \sin(\omega_1 t)-eE_2 \sin(\omega_2 t) \tag{6}$$

As shown by this formula (6), in the piezoelectric material, stresses corresponding to the frequencies ($\omega_1$, $\omega_2$) are generated.

On the other hand, formula (5) in the case where the piezoelectric characteristic is nonlinear becomes like the following formula (7). Note that, for simplicity, the effect of the deformation S is omitted, and the formula up to the second order non-linear terms will be shown.

$$T = -eE_1\sin(\omega_1 t) - eE_2\sin(\omega_2 t) - \\ e_2(E_1^2\sin^2(\omega_1 t) + 2E_1E_2\sin(\omega_1 t)\sin(\omega_2 t) + E_2^2\sin^2(\omega_2 t)) \tag{7}$$

$E_1 E_2 \sin(\omega_1 t)\sin(\omega_2 t)$ in the above formula (7) is rewritten as in the following formula (8).

$$E_1E_2 \sin(\omega_1 t)\sin(\omega_2 t)=-E_1E_2(\cos((\omega_1+\omega_2)t)-\cos((\omega_1-\omega_2)t))/2 \tag{8}$$

As understood from this formula (8), in the case where the piezoelectric characteristic is nonlinear, a stress corresponding to the frequency of $\omega_1-\omega_2$ which is different from each of $\omega_1$ and $\omega_2$ is generated. Accordingly, when the angular frequency of the transmission signal TS is $\omega_1$, and the angular frequency of the disturbing signal is $\omega_2$, a distorted signal having an angular frequency of $\omega_1+\omega_2$ will be generated.

The distorted signal due to such nonlinearity is mainly caused by the gaps 67. Specifically, this is as follows.

In a first electrode finger 63A, relative to the second electrode fingers 63B on the two sides of it, the direction toward one second electrode finger 63B (direction with respect to the crystal orientation) and the direction toward the other second electrode finger 63B (direction with respect to the crystal orientation) become reverse to each other. On the other hand, the direction of the current of the secondary distorted signal is determined by the crystal orientation. Accordingly, secondary distorted signals which are inverse to each other in polarity are input to the first electrode finger 63A from the two sides and are cancelled. This is true also for the case of focusing on the second electrode finger 63B. For this reason, the distorted signal generated in a crossing region of the first electrode finger 63A and the second electrode finger 63B is cancelled and becomes small as a whole.

On the other hand, the direction from the first electrode fingers 63A to the second dummy electrodes 65B (direction with respect to the crystal orientation) and the direction from the first dummy electrodes 65A to the second electrode fingers 63B (direction with respect to the crystal orientation) are the same as each other for all first electrode fingers 63A and first dummy electrodes 65A. Accordingly the distorted signals which are generated in the gaps 67 and are input to the first comb-shaped electrode 59A are the same as each other in polarity, therefore they are not cancelled by each other. This is true also for the case of focusing on the second comb-shaped electrode 59B.

Further, in a LiTaO$_3$ substrate or LiNbO$_3$ substrate, the nonlinearity of the permittivity in the c-axis direction of the crystal is large. Therefore, compared with the distorted signal which is generated due to the electric field in the x-direction in FIG. 6, the distorted signal which is generated due to the electric field in the y-direction becomes larger. This also due to the fact the distorted signal due to the nonlinearity of the piezoelectric material is mainly caused by the gaps 67.

Further, the capacitance element 69 acts to cancel this distorted signal generated in the gaps 67. That is, the direction from the first counter electrode 71A to the second counter electrode 71B (direction with respect to the crystal orientation) becomes reverse to the direction from the first comb-shaped electrode 59A through the plurality of gaps 67 toward the second comb-shaped electrode 59B (direction with respect to the crystal orientation), therefore the first comb-shaped electrode 59A and the first counter electrode 71A which are connected to each other receive as input distorted signals which are reverse to each other in polarity, therefore the distorted signals are cancelled. This is true also for the second comb-shaped electrode 59B and second counter electrode 71B. Due to this, the reception signal RS is improved in the SN ratio.

In particular, by satisfaction of formula (2) and formula (3), the magnitudes of the distorted signal generated in the plurality of gaps 67 and the distorted signal generated in the third gap 73 become equal to each other, therefore the distorted signals can be effectively cancelled.

Note that, secondary distorted signals become larger proportional to the square of the electric field. Therefore, even if formula (2) and formula (3) are not satisfied, so long as formula (1) is satisfied, the secondary distorted signals can be cancelled, and consequently the distorted signals as a whole can be greatly cancelled.

In the branching filter 1, the strength of the transmission signal TS is higher than the strength of the reception signal RS, therefore mainly the reception signal RS is influenced by the distorted signal generated by the transmission signal TS and disturbing signal. Further, the distorted signal generated by the transmission signal TS and disturbing signal is apt to be generated in the SAW element nearest the antenna 109, that is, the first serial resonator 15A-1.

Accordingly, by providing the capacitance element 69 in the first serial resonator 15A-1, the influence of the distorted signal upon the SN ratio can be efficiently suppressed. In particular, by providing the capacitance element 69 only in the first serial resonator 15A-1, an unnecessary increase of the parasitic capacitance can be suppressed.

Second Embodiment

Figure 5:
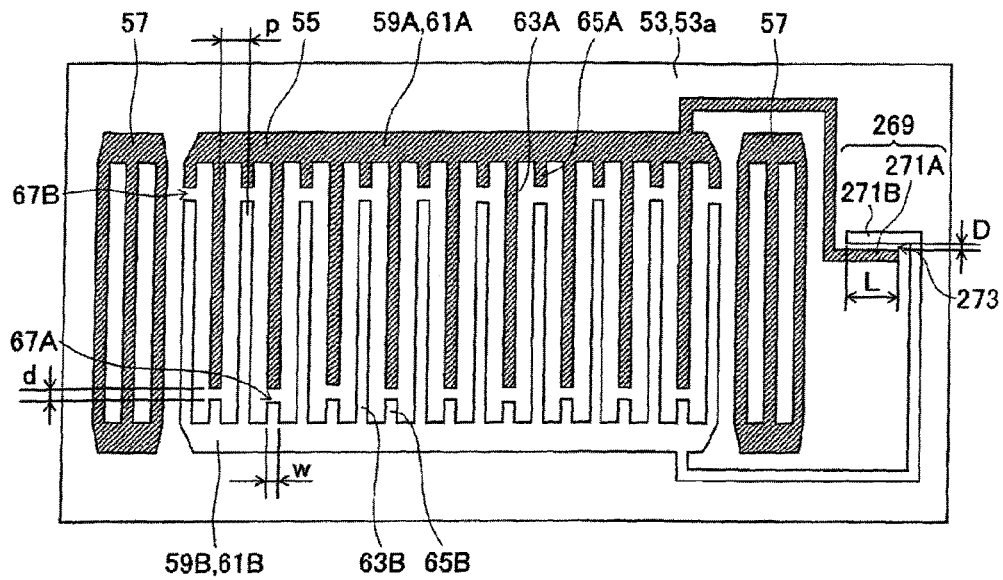
FIG. 5 A plan view which shows a SAW element according to a second embodiment.

FIG. 5 is a plan view the same as FIG. 3 and shows a SAW element 251 according to a second embodiment.

The SAW element 251, in the same way as the SAW element 51 in the first embodiment, for example configures the first serial resonator 15A-1. The SAW element 251 differs from the SAW element 51 in the first embodiment only in the setting of the gap length D and width L of the capacitance element 269 (third gap 273). Specifically, this is as follows.

The gap length D and width L of the capacitance element 269 are set so as to satisfy formula (1) in the same way as the first embodiment. Note, the gap length D and width L of the capacitance element 269 are set so as to satisfy the following formula (9) and formula (10) in place of formula (2) and formula (3).

$$D<d \qquad (9)$$

$$L<w\times n \qquad (10)$$

For example, when D=d/2 and L=(w×n)/4, formulas (1), (9), and (10) are satisfied.

In the second embodiment as well, the direction from a first counter electrode 271A connected to the first comb-shaped electrode 59A toward a second counter electrode 271B connected to the second comb-shaped electrode 59B (direction with respect to the crystal orientation) becomes reverse of the direction from the first comb-shaped electrode 59A toward the second comb-shaped electrode 59B among a plurality of gaps 67 (direction with respect to the crystal orientation), and formula (1) is satisfied. Therefore, in the same way as the first embodiment, the effect of cancellation of the distorted signals is exhibited.

Further, when satisfying formula (9) and formula (10) while satisfying formula (1), in the capacitance element 269, relative to the capacitance element 69 in the first embodiment, D is multiplied by 1/k, and L is multiplied by 1/k$^2$ (k>1). At this time, the capacitance of the capacitance element 269 becomes 1/k times the capacitance element 69. Accordingly, according to the second embodiment, compared with the first embodiment, the parasitic capacitance can be made smaller. For example, the pass frequency band of the filter can be broadened. Further, the capacitance element 269 is made smaller in size compared with the capacitance element 69 in the first embodiment, therefore a smaller size of the SAW element 251 or improvement of the degree of freedom in the arrangement of the capacitance element 269 on the substrate 53 is realized.

Third Embodiment

Figure 6:
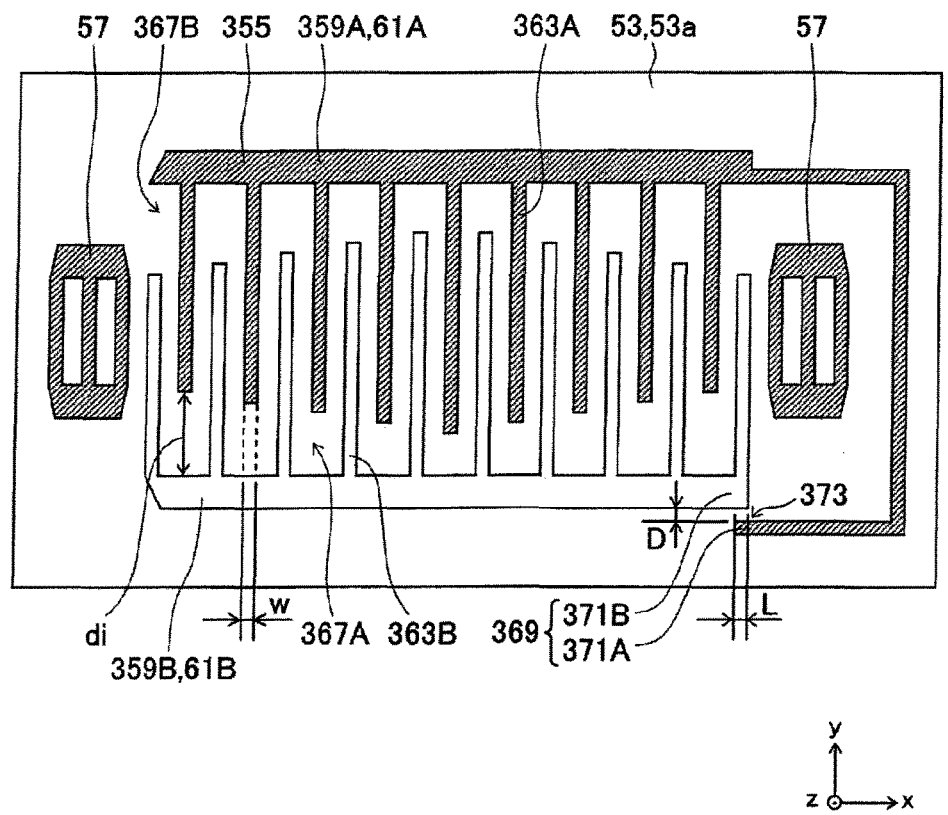
FIG. 6 A plan view which shows a SAW element according to a third embodiment.

FIG. 6 is a plan view the same as FIG. 3 and shows a SAW element 351 of a third embodiment.

An IDT 355 of the SAW element 351 is a so-called apodized one. The lengths of the plurality of electrode fingers 363 vary in accordance with the positions in the direction of propagation of the SAW. Further, the IDT 355 is not provided with any dummy electrodes. The tips of the plurality of electrode fingers 363 of one comb-shaped electrode 359 face the bus bar 61 of the other comb-shaped electrodes 359 across gaps 367.

Because of that the IDT 355 is apodized and no dummy electrodes are provided, the plurality of gaps 367 vary in their gap lengths d$_i$ in accordance with the positions in the direction of propagation of the SAW. Note that, the widths "w" of the plurality of gaps 367 are the same as each other.

The SAW element 351, in the same way as the SAW elements in the first and second embodiments, has a capacitance element 369 configured by a first counter electrode 371A and second counter electrode 371B. Note that, in the third embodiment, a portion of the second bus bar 61B is used also as the second counter electrode 371B. That is, the second bus bar 61B and the second counter electrode 371B are combined. Note that, the first bus bar 61A and the first counter electrode 371A may be combined and the second counter electrode 371B may be arranged so as to face the first counter electrode 371A as well.

In the capacitance element 369, in the same way as the SAW elements in the first and second embodiments, the direction from the first counter electrode 371A connected to the first comb-shaped electrode 359A toward the second counter electrode 371B connected to the second comb-shaped electrode 359B (direction with respect to the crystal orientation) becomes reverse to the direction from the first comb-shaped electrode 359A toward the second comb-shaped electrode 359B among the plurality of gaps 367 (direction with respect to the crystal orientation).

The gap length D and width L of the capacitance element 369 (third gap 373) are set so as to satisfy the following formula (11) obtained by generalizing formula (1) to deal with the fact that the gap lengths $d_i$ of the plurality of gaps 367 are not the same as each other.

$$\frac{L}{D^2} = \sum_{i=1}^{n} \frac{w_i}{d_i^2} \tag{11}$$

Here, $w_i$ and $d_i$ indicate the width and length of the i-th ($1 \le i \le n$) gap 367 when counted in order from one end of the IDT 355, and the right side in formula (11) is the sum of $w_i/d_i^2$. Note that, in the present embodiment, $w_i$ is the same w as each other.

The lengths $d_i$ of the plurality of gaps 367 are not constant, therefore the capacitance element 369 cannot satisfy formula (2) and consequently cannot satisfy both of formulas (2) and (3). Note, by satisfying the following formula (12), the capacitance element 369 may have a capacitance equal to the capacitance when formula (2) and formula (3) are satisfied.

$$\frac{L}{D} = \sum_{i=1}^{n} \frac{w_i}{d_i} \tag{12}$$

Alternatively, in the parasitic capacitance 369, the gap length D and width L may be set so that the parasitic capacitance becomes smaller than that when formula (12) is satisfied. That is, the following formula (13) may be satisfied.

$$\frac{L}{D} < \sum_{i=1}^{n} \frac{w_i}{d_i} \tag{13}$$

Note that, as already explained, the secondary distorted signal is proportional to the square of the electric field. Accordingly, in a case where no dummy electrodes are provided as in the present embodiment and $d_i$ is relatively large ($\Sigma(w_i/d_i^2)$ is relatively small), the distorted signal is small. In other words, the capacitance element cancelling the distorted signal particularly effectively functions in a case where dummy electrodes are provided as in the first and second embodiments.

Fourth Embodiment

Figure 7A:
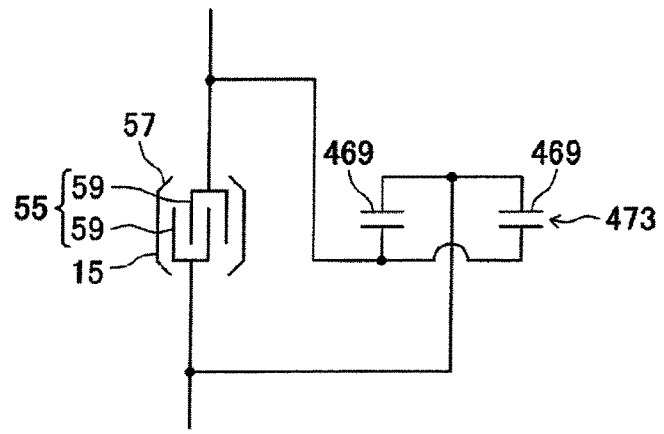
FIG. 7A is a circuit diagram which shows a SAW element according to a fourth embodiment.

FIG. 7A is a circuit diagram which schematically shows the configuration of a SAW element of a fourth embodiment.

In this SAW element, a parallel-connected plurality of (two in FIG. 7A) capacitance elements 469 are provided. In other words, in the fourth embodiment, the capacitance element in the first to third embodiments is divided. In each capacitance element 469, the direction from one counter electrode toward the other counter electrode is made a reverse direction of the direction from the comb-shaped electrode 59 connected to the one counter electrode toward the comb-shaped electrode 59 connected to the other counter electrode in the same way as the first to third embodiments.

Further, the plurality of capacitance elements 469 are configured so as to satisfy the following formula (14) obtained by generalizing formula (1) more than formula (11) corresponding to there being a plurality of capacitance elements.

$$\sum_{j=1}^{m} \frac{W_j}{D_j^2} = \sum_{i=1}^{n} \frac{w_i}{d_i^2} \tag{14}$$

Here, "m" is the total number (2 in FIG. 7) of third gaps 473 of the capacitance elements 469, $D_j$ and $W_j$ are the length and width of the third gap of the j-th ($2 \le j \le m$) capacitance element 469, and the left side of formula (14) is the sum of $W_j/D_j^2$.

Note that, corresponding to there being a plurality of capacitance elements 469, the plurality of capacitance elements 469 may also satisfy the following formula (15) and formula (16) obtained by generalizing formula (2) and formula (3).

For all $j$, $D_j = d$ \hfill (15)

$$\sum_{j=1}^{m} W_j = \sum_{i=1}^{n} w_i \tag{16}$$

Alternatively, the plurality of capacitance elements 469 may satisfy the following formula (17) obtained by generalizing formula (13) corresponding to there being a plurality of capacitance elements 469.

$$\sum_{j=1}^{m} \frac{W_j}{D_j} < \sum_{i=1}^{n} \frac{w_i}{d_i} \tag{17}$$

Further, the plurality of capacitance elements 469, in addition to formula (17), may satisfy the following formula (18) and formula (19) obtained by generalizing formula (9) and formula (10) corresponding to there being a plurality of capacitance elements 469.

For all $j$ and $i$, $D_j < d_i$ \hfill (18)

$$\sum_{j=1}^{m} W_j < \sum_{i=1}^{n} w_i \tag{19}$$

According to the fourth embodiment, the same effects as those by the first to third embodiments are obtained. Further, the capacitance elements 469 can be arranged dispersed, therefore improvement of the degree of freedom of layout on the substrate 53 can be expected.

Fifth Embodiment

Figure 7B:
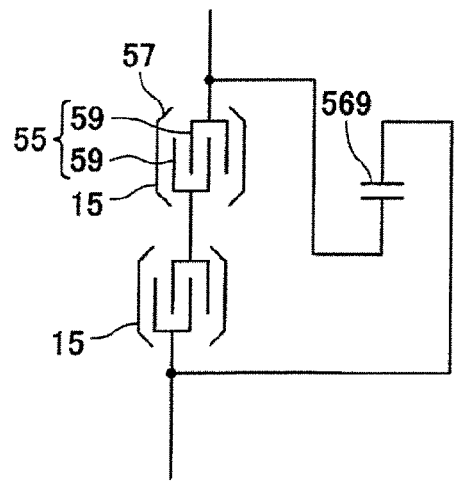
FIG. 7B is a plan view which shows a SAW element according to a fifth embodiment.

FIG. 7B is a circuit diagram which schematically shows the configuration of a SAW element of a fifth embodiment.

In this SAW element, one capacitance element 569 is provided from a serially connected plurality of (two in FIG. 7B) resonators 15. From another viewpoint, in the fifth embodiment, the resonator 15 in the first to third embodiments is divided. In the capacitance element 569, the direction from one counter electrode toward the other counter electrode is made the reverse direction of the direction from the comb-shaped electrode 59 (directly or through the other resonator 15) connected to the one counter electrode toward the comb-shaped electrode 59 (through the other resonator 15 or directly) connected to the other counter electrode in the same way as the first to third embodiments.

According to the fifth embodiment, the same effects as those in the first to third embodiments are obtained. Further, by division of the resonator 15, the distorted signal is reduced, and in addition the distorted signal due to the capacitance element 569 will be reduced, therefore the distorted signal is more suitably reduced.

Sixth Embodiment

Figure 8:
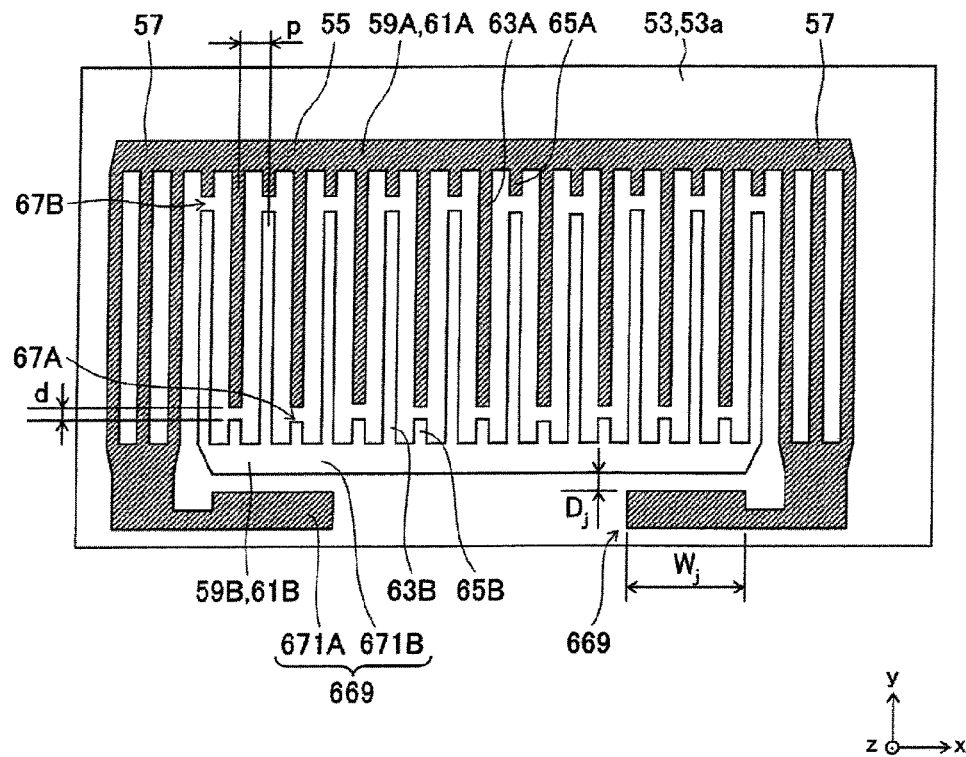
FIG. 8 A plan view which shows a SAW element according to a sixth embodiment.

FIG. 8 is a plan view the same as FIG. 3 and shows the configuration of a SAW element 651 of a sixth embodiment.

The SAW element 651, in the same way as the SAW element in the fourth embodiment, has a plurality of (two in FIG. 8) capacitance elements 669. The plurality of capacitance elements 669, in the same way as the plurality of capacitance elements 469 in the fourth embodiment, satisfy formula (14) etc. The second counter electrode 671B of the capacitance element 669, in the same way as the third embodiment, is integrally formed together with the second bus bar 61B of the IDT 55.

The SAW element 651 utilizes reflectors 57 for connection of the comb-shaped electrode 59A of the IDT 55 and the first counter electrodes 71A. That is, the first bus bar 61A of the comb-shaped electrode 59A and the bus bar of the reflectors 57 on the positive side of the y-direction are connected, and the first counter electrodes 671A and the bus bars of the reflectors 57 on the negative side of the y-direction are connected.

According to the sixth embodiment, the same effects as those by the first to fifth embodiments are obtained. Further, the reflectors 57 are utilized as a portion of the interconnects for connecting the IDT 55 and the capacitance elements 669, therefore the space which is necessary for the interconnects can be reduced, so the SAW element is made smaller in size.

Seventh Embodiment

Figure 9:
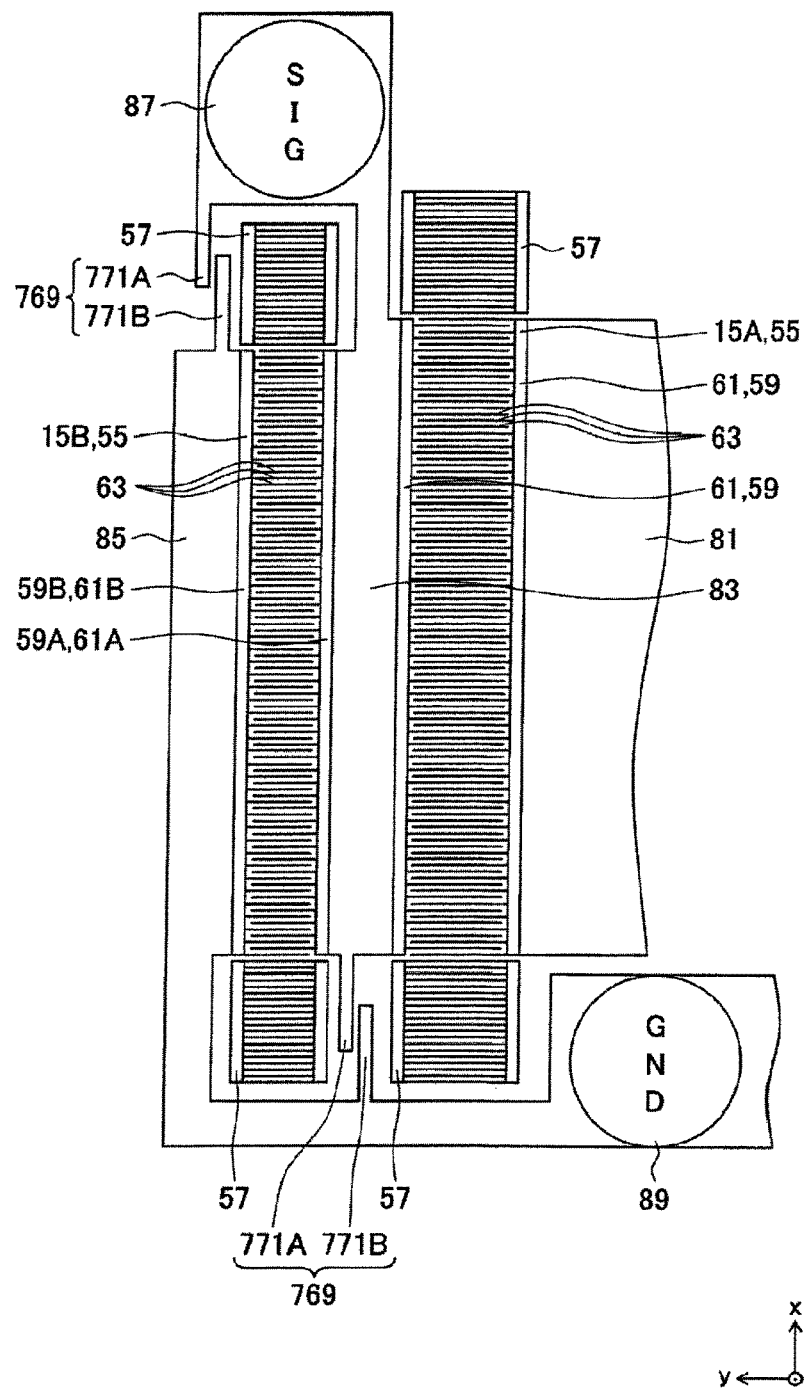
FIG. 9 A plan view which shows a portion of the branching filter according to a seventh embodiment.

FIG. 9 is a plan view which shows the configuration of a portion of a branching filter 701 of a seventh embodiment.

In the branching filter 701, a capacitance element 769 and the IDT 55 are connected by utilizing interconnects for connection among DT's 55 or interconnects for connecting the IDT 55 and the terminals. Specifically, for example, this is as follows.

The branching filter 701 has a serial resonator 15A and a parallel resonator 15B which configure a ladder type filter. Each resonator 15 is, in the same way as the other embodiments, configured by a SAW element and has an IDT 55 and reflectors 57.

The branching filter 701 has an input side signal interconnect 81 for inputting a signal to the serial resonator 15A, an output side signal interconnect 83 for outputting a signal from the serial resonator 15A to an output terminal 87, and a ground interconnect 85 which is connected to a ground terminal 89 given a reference potential. The input side signal interconnect 81 extends from a not shown input terminal or a serial resonator 15A other than the shown serial resonator 15A.

In the parallel resonator 15B, the first comb-shaped electrode 59A is connected to the output side signal interconnect 83, and the second comb-shaped electrode 59B is connected to the ground interconnect 85. The parallel resonator 15B functions to allow an unnecessary signal component to escape to the ground terminal 89. Unlike the form in FIG. 2, in the branching filter in FIG. 9, the parallel resonator 15B is arranged electrically nearest the antenna terminal, therefore a distorted signal generated in this parallel resonator 15B is apt to become large. For this reason, the reduction of the distorted signal generated in the parallel resonator 15B is important for reducing the distorted signal output of the entire branching filter.

The capacitance element 769 is provided at for example two positions. The capacitance elements 769 has a first counter electrode 771A which extends from the output side signal interconnect 83 and a second counter electrode 771B which extends from the ground interconnect 85.

Accordingly, the first counter electrode 771A is connected through the output side signal interconnect 83 to the first comb-shaped electrode 59A of the parallel resonator 15B, while the second counter electrode 771B is connected through the ground interconnect 85 to the second comb-shaped electrode 59B of the parallel resonator 15B.

The direction from the first counter electrode 771A toward the second counter electrode 771B is the reverse direction of the direction from the first comb-shaped electrode 59A toward the second comb-shaped electrode 59B in the parallel resonator 15B. Further, the capacitance elements 769, in the same way as the fourth embodiment etc., satisfy formula (14) etc.

According to the seventh embodiment, the same effects as those by the first to sixth embodiments are obtained. Further, the interconnects among the DT's 55 or the interconnects for connecting the IDT 55 and the terminals are utilized as the interconnects for connecting the comb-shaped electrode 59 and the counter electrode 771, therefore the space which is necessary for interconnects can be reduced, so the SAW element is made smaller in size.

Eighth Embodiment

Figure 10:
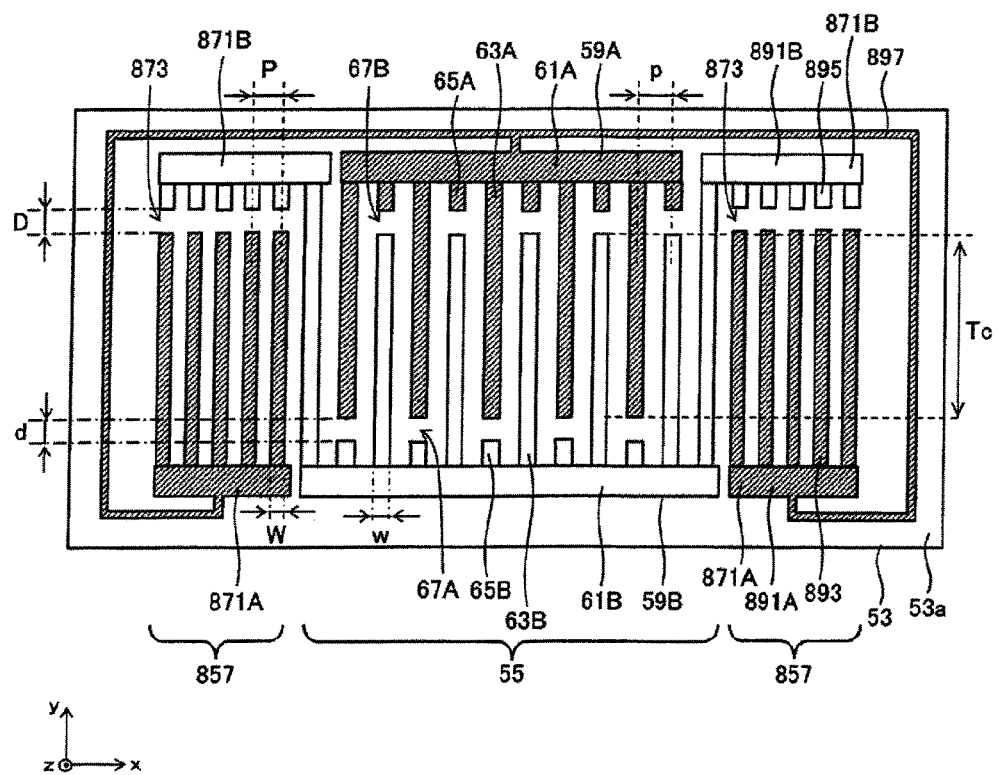
FIG. 10 A plan view which shows a SAW element according to an eighth embodiment.

FIG. 10 is a plan view the same as FIG. 3 and shows the configuration of a SAW element 851 of an eighth embodiment.

The SAW element 851 utilizes reflectors 857 as the capacitance elements. Specifically, this is as follows.

The reflector 857 has a first counter electrode 871A and a second counter electrode 871B. The first counter electrode 871A has a third bus bar 891A and a plurality of third electrode fingers 893 which extend from the third bus bar 891A. The second counter electrode 871B has a fourth bus bar 891B and a plurality of fourth electrode fingers 895 which extend from the fourth bus bar 891B.

The third bus bar 891A and fourth bus bar 891B extend in the direction of propagation of the SAW and are formed in long shapes. The third bus bar 891A and fourth bus bar 891B are arranged so as to face each other. The third bus bar 891A and the fourth bus bar 891B are for example parallel to each other, and a distance between the two is constant in the direction of propagation of the SAW.

The plurality of third electrode fingers 893 roughly linearly extend from the third bus bar 891A toward the fourth bus bar 891B with a constant width. The plurality of third electrode fingers 893 are arranged at a constant pitch P along the direction of propagation of the SAW (x-direction). The pitch P of the plurality of third electrode fingers 893 is for example equal to the pitch "p" of the electrode fingers 63 of the IDT 55.

The lengths of the third electrode fingers 893 are for example the same as each other in the plurality of third electrode fingers 893 and are equal to the lengths of the electrode fingers 63 of the IDT 55. Further, the widths W of the third electrode fingers 893 are for example the same as each other among the plurality of third electrode fingers 893 and are equal to the widths "w" of the electrode fingers 63 of the IDT 55.

The plurality of third electrode fingers 893 are connected to each other, therefore become the same in potential. Due to the plurality of third electrode fingers 893 of the same potential being arranged adjacent to each other, the SAW leaking out of the IDT 55 along the x-direction can be reflected to the IDT 55 side. That is, the reflectors 57 have a function of reflecting the SAW.

The fourth electrode fingers 895 are made shorter in their lengths than the lengths of the third electrode fingers 893. For example, they are the same as the lengths of the dummy electrodes 65 of the IDT 55. The number, width, pitch etc. of the fourth electrode fingers 895 are for example the same as the third electrode fingers 893.

The reflectors 857 in the SAW element 851 are configured so as to have, other than the function of reflecting the SAW, a function of suppressing the influence of the distorted wave which may be generated in the SAW element 851 upon the SN ratio.

As the configuration for this purpose, first, in the reflectors 857, the direction from the first counter electrode 871A toward the second counter electrode 871B becomes reverse of the direction from the first bus bar 61A toward the second bus bar 61B. That is, in FIG. 10, in contrast to the direction from the first counter electrode 871A toward the second counter electrode 871B being toward the +y direction, the direction from the first bus bar 61A toward the second bus bar 61B becomes the −y direction.

The first counter electrodes 871A arranged in this way are electrically connected to the first comb-shaped electrode 59A, and the second counter electrodes 871B are electrically connected to the second comb-shaped electrode 59B. Specifically, the third bus bar 891A of the first counter electrode 871A and the first bus bar 61A of the first comb-shaped electrode 59A are connected through a connecting interconnect 897 formed on the upper surface 53a of the piezoelectric substrate 53. The fourth bus bar 891B of the second counter electrode 871B and the second bus bar 61B of the second comb-shaped electrode 59B are connected through the second electrode fingers 63B which are positioned on the two ends of the IDT 55.

Further, the third electrode fingers 893 are formed so that their tips have third gaps 873 between them and the second counter electrode 871B (fourth electrode fingers 895 in the SAW element 851). The width of the third gaps 873 is the same as the width W of the third electrode fingers 893.

The gap length D and width W of the third gaps 873 are set so as to satisfy the above-explained formula (14).

Here, m is an integer of 2 or more and is the total number of the third gaps 873 provided in a pair of reflectors 857. Further, $D_j$ and $W_j$ are the gap length and gap width of the j-th third gap 873.

Note that, it is assumed that the j-th third gap 873 is the j-th third gap 873 in the serially counted gaps of the third gaps 873 of a pair of reflectors 857 as a whole. The gaps are counted from the third gap 873 which is positioned on the left end or right end in the pair of reflectors 857 as a whole as the first (j=1).

In the SAW element 851, the above formula (14) is satisfied by the gap length D and gap width W being set so as to satisfy for example formula (15) and formula (16) explained above.

Note that, in the same way as the first embodiment, the configurations of the serial resonator 15A other than the first serial resonator 15A-1, parallel resonator 15B, and auxiliary resonator 15C may be the same as those of the conventional ones which do not have configurations for reducing the distorted wave. Note that, in these resonators 15 as well, reflectors 857 the same as those in the first serial resonator 15A-1 may be provided as well.

By satisfaction of formula (14), in the same way as the first to seventh embodiments, the effect of reduction of the distorted wave is exhibited. Further, in the present embodiment, the reflectors 857 are utilized as capacitance elements, therefore the space for arranging the capacitance elements is reduced.

Further, in the SAW element 851, the third gaps 873 are positioned at locations which are outside of a region Tc which is obtained by extending the crossing region of the first electrode fingers 63A and the second electrode fingers 63B along the x-direction. By arrangement of the third gaps 873 in a region outside of the region Tc, deterioration of the function of the reflectors 857 for reflecting the SAW can be suppressed.

Figure 11:
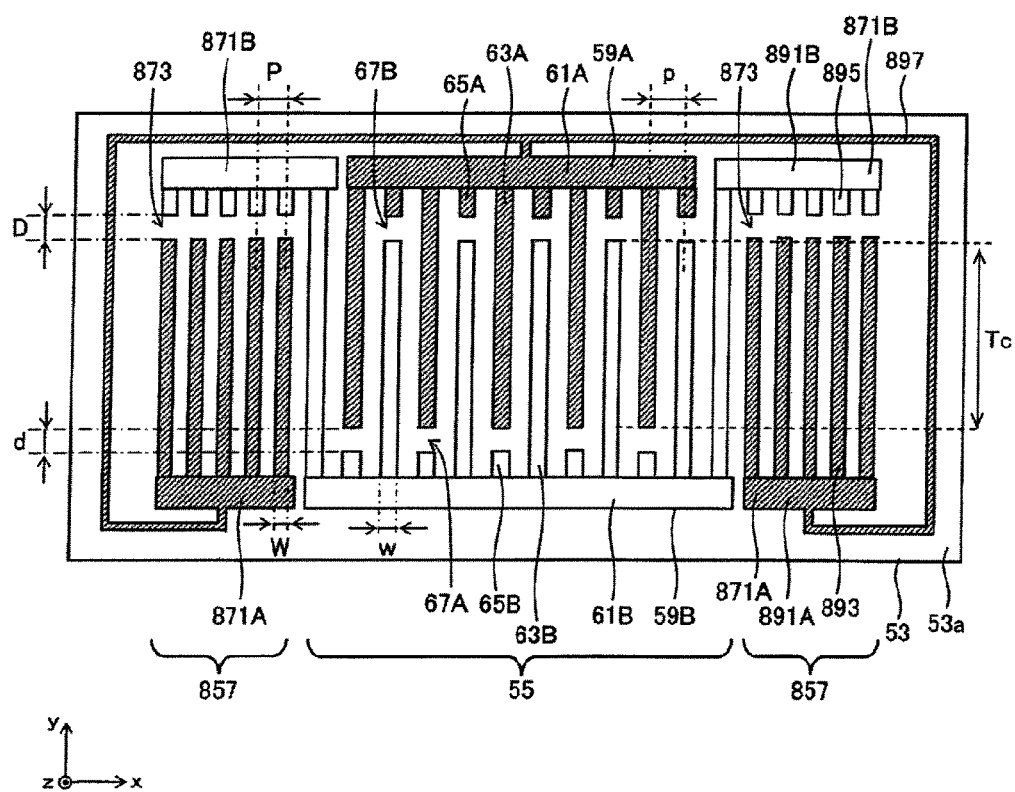
FIG. 11 A plan view which shows a modification of the SAW element in FIG. 10.

FIG. 11 is a plan view which shows a modification of the SAW element 851 according to the eighth embodiment. In the SAW element 851 shown in FIG. 10, the second counter electrode 871B of the reflector 857 had the fourth electrode fingers 895, and the tips of the third electrode fingers 893 were positioned so as to have the third gaps 873 with the tips of the fourth electrode fingers 895. However, in the modification in FIG. 11, the fourth electrode fingers 895 are not provided. That is, in the modification shown in FIG. 11, the tips of the third electrode fingers 893 are positioned so as to have a third gap 873 with respect to the fourth bus bar 891B to which the plurality of fourth electrode fingers 895 were commonly connected in FIG. 10.

Figure 12:
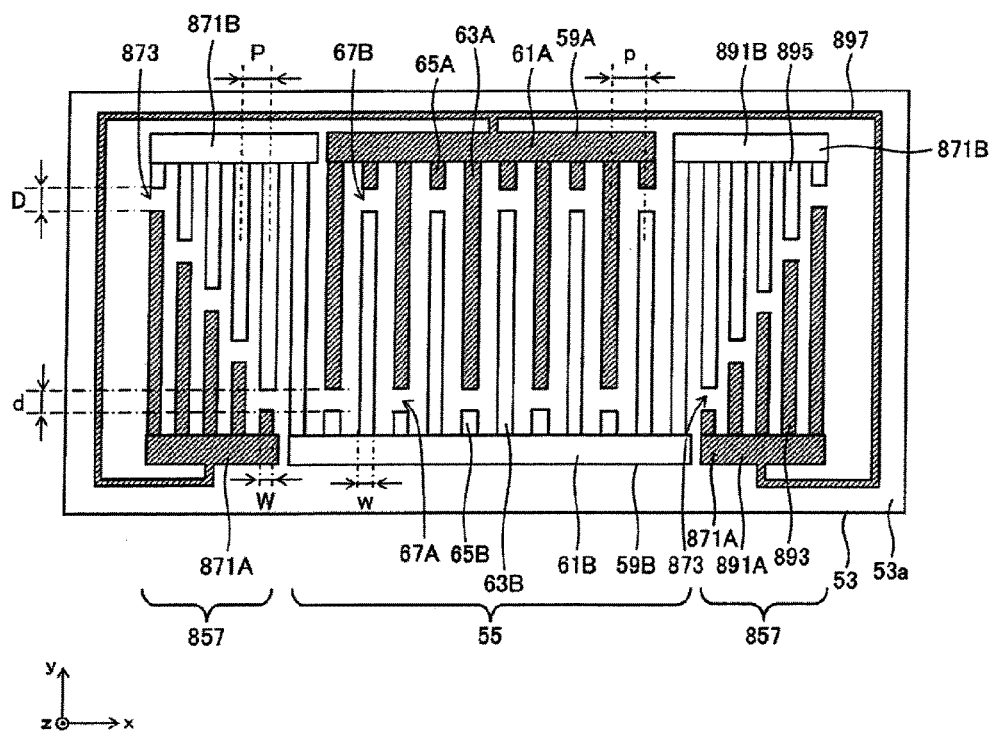
FIG. 12 A plan view which shows another modification of the SAW element in FIG. 10.

FIG. 12 is a plan view which shows another modification of the SAW element 851 according to the eighth embodiment. In the modification shown in FIG. 12, when viewing the third gaps 873 along the direction of propagation of the SAW (x-direction), the positions of the third gaps 873 are deviated in the y-direction. In other words, the tips of the third electrode fingers 893 and the tips of the fourth electrode fingers 895 are at positions which are deviated in the y-direction when viewing them in the x-direction, therefore the lengths of the third electrode fingers 893 and the lengths of the fourth electrode fingers 895 are different.

Ninth Embodiment

Figure 13:
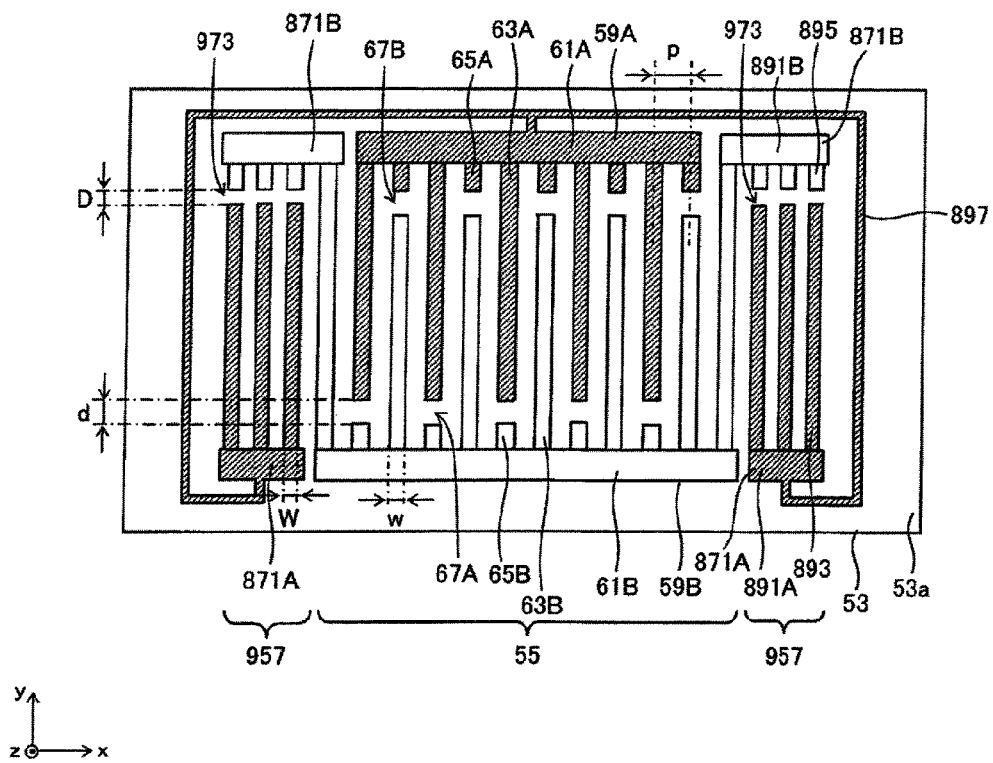
FIG. 13 A plan view which shows a SAW element according to a ninth embodiment.

FIG. 13 is a plan view the same as FIG. 3 and shows a SAW element 951 according to a ninth embodiment.

The SAW element 951 differs from the SAW element 851 in the eighth embodiment only in the gap length D and number of gaps (sum of the gap widths W) of the third gaps 973 in the reflectors 957. Specifically, this is as follows.

The gap length D and number of gaps of the third gaps 973 are set so as to satisfy formula (14) in the same way as the eighth embodiment. Note, the gap length D and number of gaps of the third gaps 973 are set so as to satisfy the already explained formula (18) and formula (19) in place of formula (15) and formula (16).

Note, in the SAW element 951, it is assumed that the gap lengths $D_j$ of the third gaps 973 are equal ($D_j$=constant) and gap lengths $d_i$ of the first and second gaps are equal ($d_i$=constant).

In the ninth embodiment as well, the direction from the first bus bar 61A toward the second bus bar 61B becomes the reverse of the direction from the third electrode fingers 893 toward the second counter electrode 871B among the third gaps 973, and formula (14) is satisfied. Therefore, in the same way as the eighth embodiment, the effect of cancellation of the distorted signal is exerted.

Further, formula (18) and formula (19) are satisfied while satisfying formula (14). Therefore, as explained in the second embodiment, the parasitic capacitance can be made smaller. For example, the pass frequency band of the filter can be broadened. Further, the reflectors 957 are smaller in size compared with the reflectors 857 in the eighth embodiment, therefore the SAW element 951 is smaller in size or the degree of freedom of arrangement of the reflectors 957 on the substrate 53 is improved.

<Range of Suitable Numerical Values for Capacitance Element>

In the embodiments explained above, the capacitance elements satisfied formula (1), formula (11), or formula (14). That is, in these formulas, the values at the left side and the values at the right side matched. However, even if the values at the left side and the values at the right side do not completely match, so long as these values are close, the effect of cancellation of the distorted signal is exerted. Therefore, in the following description, the suitable range of the values ($L/D^2$ etc.) at the left side of these formulas will be studied.

The power of the distorted signal which is generated when inputting a signal having a predetermined power to the SAW element which has the same configuration as that of the SAW element of the first or second embodiment (with dummy electrode, not apodized, one capacitance element) was computed by simulation. Conditions of simulation are as follows.

Piezoelectric Substrate:
 Material: LiTaO$_3$
 Cut angle: 42° Y-cut X-propagated
IDT:
 Material: Al—Cu
 Electrode finger:
  Number (n): 140 (70 pairs)
  Pitch (p): 2.3 μm (λ=4.6 um)
  Gap length (d): 0.75 μm
  Width (w): 1.15 μm
  Crossing width: 20λ (see Tc in FIG. 10)
 Resonance frequency: vicinity of 850 MHz
Capacitance Element:
 Gap length (D): D=d
 Width (L): 0≤L/L$_0$≤2 (L$_0$=Σw$_i$=w×n)
Input Signal
 Power: 22 dBm
 Frequency: 950 MHz
Computation target: Power of secondary higher harmonic (1900 MHz)

As described above, the gap length D of the capacitance element was made the same as the gap length "d" of the electrode fingers. Further, the width L of the capacitance element was divided by L$_0$ to normalize it and was changed within a range of 0 to 2. Note that, formula (11) is satisfied when L/L$_0$=1.

In the IDT under the above conditions, with an input signal in the vicinity of the resonance frequency of 850 MHz, the mechanical vibration become large. A large distorted signal accompanying this mechanical vibration (distorted signal caused by the nonlinearity of the deformation S in formula (5)) is generated. For this reason, a distorted signal based on the electric field which was shown by formula (8) etc. can be measured with a smaller error when measured by an input signal of 950 MHz. Therefore, the power of the secondary higher harmonic (1900 MHz) generated by the input signal of 950 MHz was calculated as the power of the distorted wave. Note that, in IMD in an actual branching filter, the transmission wave is in the vicinity of the resonance frequency. However, the disturbing wave greatly differs from the resonance frequency, therefore the mechanical vibration accompanying the disturbing wave becomes small. For this reason, the distorted signal accompanying the mechanical vibration becomes smaller, therefore the distorted signal based on the electric field becomes relatively large.

Figure 14:
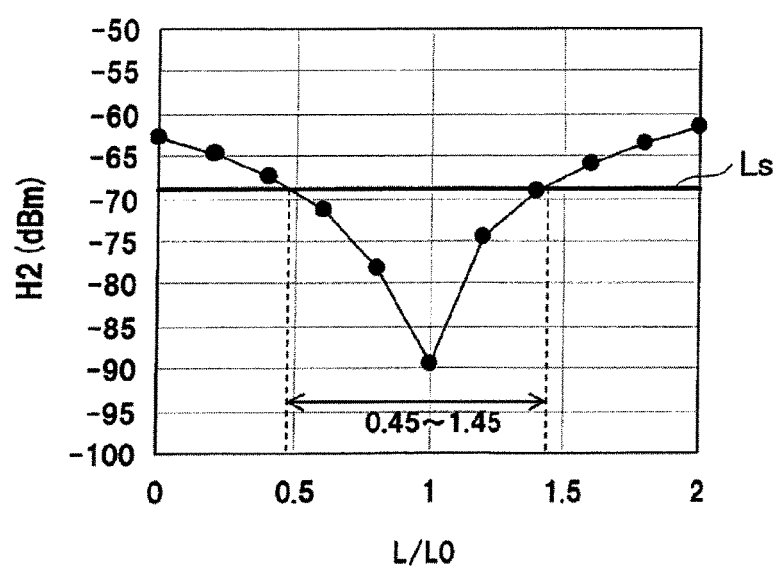
FIG. 14 A diagram which shows the results of simulation calculation for a secondary higher harmonic.

FIG. 14 is a diagram which shows the computation results. An abscissa shows L/L$_0$, and an ordinate shows the power of the secondary higher harmonic (H2).

As shown in this diagram, when L/L$_0$=1 when formula (11) is satisfied, the power of the secondary higher harmonic becomes the smallest. Further, if L/L$_0$ becomes larger than 0, even when the extent is small, or if L/L$_0$ becomes smaller than 2, even when the extent is small, compared with the case where L/L$_0$=0 (no capacitance element), the power of the secondary higher harmonic is reduced.

Accordingly, as the preferred range of $L/D^2$, the following formula (20) is derived.

$$0 < \frac{L}{D^2} < 2\sum_{i=1}^{n} \frac{w_i}{d_i^2} \tag{20}$$

Further, formula (14) obtained by generalizing formula (11) more corresponding to there being a plurality of capacitance elements is based on the same theory as formula (11). Therefore, in the same way as formula (20), the following formula (21) is derived.

$$0 < \sum_{j=1}^{m} \frac{W_j}{D_j^2} < 2\sum_{i=1}^{n} \frac{w_i}{d_i^2} \tag{21}$$

As explained in the background art, in place of one IDT, two serially connected IDT's having a combined capacity equal to that of the above one IDT are sometimes provided. In this case, the voltage applied to each IDT becomes ½. On the other hand, the strength of the distorted current of the secondary higher harmonic is proportional to the square of the voltage, therefore the signal strength of the secondary higher harmonic in each IDT is reduced to ¼. When considering the fact that there are two IDT's, the total signal strength of the secondary higher harmonic becomes ½. That is, the power of the secondary higher harmonic generated from the two serially connected IDT falls by 6 dBm from the power in the case where the IDT is not divided. A line Ls in FIG. 14 shows the power when this effect of reduction of 6 dBm is obtained.

By providing the capacitance element, from the viewpoint of obtaining an effect at least equal to that in the case where the IDT is divided (effect of reduction of 6 dBm or more), $L/L_0$ is preferably within a range where the power of the secondary higher harmonic becomes a value smaller than the line Ls, that is, a range from 0.45 to 1.45. Accordingly, the following formula (22) and formula (23) are derived.

$$0.45 \sum_{i=1}^{n} \frac{w_i}{d_i^2} < \frac{L}{D^2} < 1.45 \sum_{i=1}^{n} \frac{w_i}{d_i^2} \tag{22}$$

$$0.45 \sum_{i=1}^{n} \frac{w_i}{d_i^2} < \sum_{j=1}^{m} \frac{W_j}{D_j^2} < 1.45 \sum_{i=1}^{n} \frac{w_i}{d_i^2} \tag{23}$$

EXAMPLES

SAW elements were actually fabricated, and the effect of reduction of distortion was studied. Specifically, signals were input to the SAW elements in a plurality of sets of comparative examples and examples, and the secondary higher harmonics (H2) generated as a result were measured by a spectrum analyzer.

The conditions common to the plurality of comparative examples and examples will be shown below.
Resonance frequency of IDT: Vicinity of 850 MHz
Input signal:
Power: 22 dBm
Frequency: 750 to 950 MHz
Frequency of secondary higher harmonic (measurement target): 1500 to 1900 MHz Comparative Example 1 and Examples 1 to 3

The conditions of the piezoelectric substrates and DT's in Comparative Example 1 and Examples 1 to 3 are roughly the same as the conditions of the simulation calculation explained above.

Only one capacitance element was provided in the same way as FIG. 5. It was positioned on the side opposite to the IDT relative to the reflector. The gap length D of the capacitance element was made the same as the gap length "d" of the electrode fingers. The widths L of the capacitance elements were set to the following values.
Comparative Example 1: L=0
Example 1: 80.9 μm
Example 2: 161.7 μm
Example 3: 323.4 μm
Note that, $L_0$=w×n=1.15×140=161. That is, L=80.9 μm in Example 1 corresponds to $L/L_0$=0.5, 161.7 μm in Example 2 corresponds to $L/L_0$=1.0, and 323.4 μm in Example 3 corresponds to $L/L_0$=2.0.

Figure 15A:
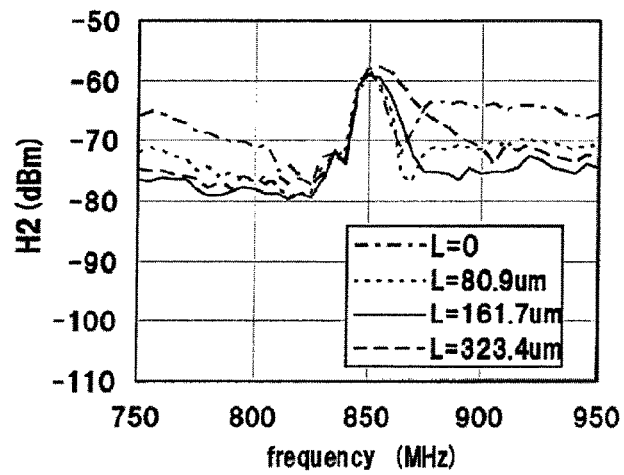
FIG. 15A, FIG. 15B and FIG. 15C are diagrams which show the results of actual measurement of the secondary higher harmonics in SAW elements in the comparative examples and examples.

FIG. 15A is a diagram which show the measurement results, in which the abscissa shows the frequencies of the input signals, and the ordinate shows the power of the secondary higher harmonics based on those input signals. As described before, for an input signal in the vicinity of the resonance frequency of 850 MHz, a large distorted signal accompanied with mechanical vibration is generated, and the power of the secondary higher harmonic becomes the peak. The distorted signal based on the electric field shown by formula (8) etc. does not have a clear peak since it is generated irrespective of the mechanical resonance, therefore it has become almost a constant background over the entire frequency. Note, in the vicinity of the resonance frequency, the impedance of the resonator becomes small and the voltage between the two terminals of the resonator becomes small, therefore the distorted signal based on the electric field becomes small as well. By taking the influences by them into account, the distorted signal with respect to the input frequency in the vicinity of 950 MHz which is sufficiently distant from the resonance frequency, was regarded as the distorted signal based on the electric field.

In the vicinity of 950 MHz, in all of Examples 1 to 3, the power of the secondary higher harmonic falls compared with Comparative Example 1. Accordingly, it was confirmed that the distorted wave was reduced by providing a capacitance element, and the validity of formula (20) and formula (21) was confirmed. Further, the peak value in the vicinity of 850 MHz is consequently not changed much at all. This is a suitable result since there is no effect of reduction of the distorted signal accompanied with mechanical vibration in the resonators in the present invention.

Comparative Example 2 and Examples 4 and 5

The conditions of the piezoelectric substrates and IDT's in Comparative Example 2 and Examples 4 and 5 are roughly the same as the conditions of the simulation calculation explained above. Note, the number of electrode fingers was made 160.

Two capacitance elements were provided in the same way as FIG. 8, the reflectors were utilized as the interconnects for connecting the IDT's and the capacitance elements, and the bus bars of the IDT's were used as the counter electrodes. The gap lengths D of the capacitance elements were made the same as the gap lengths "d" of the electrode fingers. The widths L of the capacitance elements were made the following values.
Comparative Example 2: L=0
Example 4: 92.4 μm
Example 5: 184.8 μm
Note that, $L_0$=w×n=1.15×160=184. That is, L=92.4 μm in Example 4 corresponds to $L/L_0$=0.5, and 184.8 μm in Example 5 corresponds to $L/L_0$=1.0.

Figure 15B:
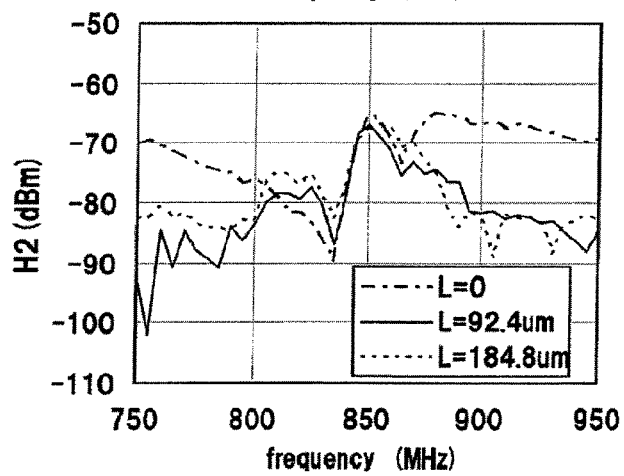

FIG. 15B is a diagram the same as FIG. 15A and shows the measurement results. In the vicinity of 950 MHz, in both of Examples 4 and 5, compared with Comparative Example 2, the power of the secondary higher harmonic falls. Accordingly, it was confirmed that the distorted wave was reduced by providing a capacitance element, and the validity of formula (20) and formula (21) was confirmed.

Comparative Example 2 and Examples 6 to 8

The conditions of the piezoelectric substrates and IDT's in Comparative Example 2 and Examples 6 to 8 are roughly the same as the conditions of the simulation calculation explained above. Note, the number of the electrode fingers was made 160. Comparative Example 2 is the same as Comparative Example 2 which was compared with Examples 4 and 5.

The capacitance element was configured by a pair of reflectors in the same way as FIG. 10. The gap length D and width W of the electrode fingers of the reflectors were made the same as the gap length "d" and width "w" of the electrode fingers of the IDT. The number of electrode fingers of the reflectors was made the following values.
Comparative Example 2: 0
Example 6: 30×2
Example 7: 55×2
Example 8: 80×2

Note that, W=w and n=160, therefore 30×2 in Example 6 corresponds to $L/L_0$=0.38, 55×2 in Example 7 corresponds to $L/L_0$=0.69, and 60×2 in Example 8 corresponds to $L/L_0$=1.0.

Figure 15C:
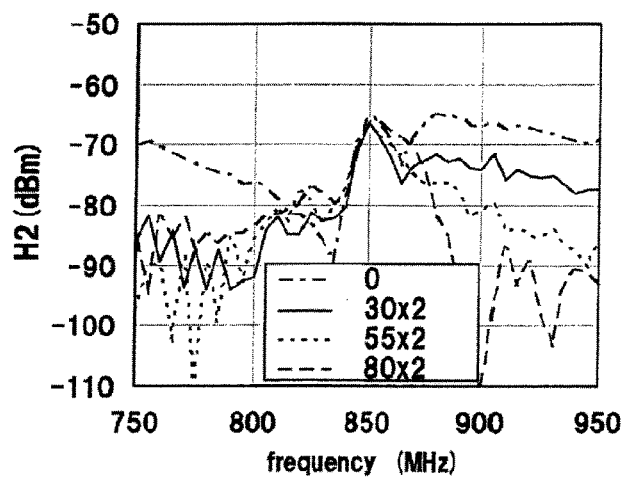

FIG. 15C is a diagram the same as FIG. 15A and shows the measurement results. In the vicinity of 950 MHz, in all of Examples 6 to 9, compared with Comparative Example 2, the power of the secondary higher harmonic falls. Accordingly, it was confirmed that the distorted wave was reduced by providing a capacitance element, and the validity of formula (20) and formula (21) was confirmed.

The present invention is not limited to the above embodiments and may be executed in various ways.

The acoustic wave element is not limited to a SAW element (in a narrow sense). For example, the acoustic wave element may be a so-called elastic boundary wave element (note, included in a SAW element in a broad sense) as well.

The shape of the IDT is not limited to the one shown in the figures. For example, the IDT may be one which is not apodized and is not provided with dummy electrodes or may be one which is apodized and is provided with dummy electrodes. Further, the IDT may be one in which a bus bar is inclined or bent or may be one in which the size of the bus bar in the direction (y-direction) perpendicular to the direction of propagation of the acoustic wave changes (the position of the edge part of the bus bar on the electrode finger side in the y-direction changes). Further, in the IDT, a portion having electrode fingers given a pitch which becomes narrower may be provided or a portion in which two or more electrode fingers which extend from one comb-shaped electrode are adjacent without sandwiching an electrode finger extending from the other comb-shaped electrode therebetween may be provided. Further, the electrode fingers or dummy electrodes may have corners on the tip ends which are chamfered or the dummy electrodes may have widths of the tips (x-direction) which are made larger.

Note that, assuming that $\Sigma(w_i/d_i^2)$ is equivalent to integration of $1/d_i^2$ to the width direction (x-direction). Accordingly, by chamfering the corners of the tips of the electrode fingers or forming an oblique bus bar in the comb-shaped electrode without a dummy electrode or the like, even in a case where the lengths of the gaps (67 etc.) are not constant in the width direction (x-direction), $\Sigma(w_i/d_i^2)$ can be applied by utilizing integration. In place of integration, $\Sigma(w_i/d_i^2)$ may be calculated by using an approximate representative value. This is true also for the gaps of the capacitance elements and the other formulas.

The capacitance element is not limited to a so-called gap type. For example, the capacitance element may have a third comb-shaped electrode and fourth comb-shaped electrode which mesh with each other in the same way as an IDT. In this case, the third comb-shaped electrode and fourth comb-shaped electrode are arranged so that the electrode fingers extend in the direction perpendicular to the direction of propagation of the acoustic wave in the same way as the IDT, and the direction from the third comb-shaped electrode connected to the first comb-shaped electrode toward the fourth comb-shaped electrode connected to the second comb-shaped electrode is made the reverse direction of the direction from the first comb-shaped electrode toward the second comb-shaped electrode. In the third comb-shaped electrode and fourth comb-shaped electrode, gaps which contribute to the cancellation of the distorted wave are the gaps (corresponding to 67) of the tips of the plurality of electrode fingers of the capacitance element. Accordingly, the third comb-shaped electrode and fourth comb-shaped electrode can be grasped as resulting from capacitance elements being provided for each gap and being connected in parallel, and Dj and Wj of the gap may be set in the same way as the fourth embodiment shown in FIG. 7A.

Note that, the third comb-shaped electrode and fourth comb-shaped electrode have capacitances even in the gaps on the lateral side of the electrode fingers (gap between electrode fingers in the x-direction). Accordingly, the capacitance is larger compared with a gap type capacitance element. Such a third comb-shaped electrode and fourth comb-shaped electrode can be used also as for example additional capacitance elements used for the adjustment of the pass band. Note that, the gap type capacitance elements can be utilized for adjustment of the passband as well.

The IDT and the capacitance element may be suitably connected. For example, the capacitance element may be connected to not a bus bar, but the electrode fingers.

Note that, the capacitance element need not be provided for each IDT, but may be provided in common with respect to a plurality of IDT's and satisfy formula (11) or formula (14) with respect to the plurality of IDT's. Note, the spectrum of the distorted wave is different for each IDT. Therefore, as shown in the embodiments, preferably a capacitance element is provided for each IDT and formula (11) or formula (14) etc. is satisfied. Note, in a case where for example one resonator is serially divided into two resonators having the same size explained before, each resonator has the same characteristics, therefore common provision of a capacitance element with respect to a plurality of IDT's is effective in terms of reduction of space etc.

Further, the capacitance element may be provided on a piezoelectric substrate which is different from the piezoelectric substrate provided with the IDT. Even in this case, the crystal orientations only have to become reverse between the capacitance element and the IDT. For example, in the branching filter, in a case where a transmission side filter chip and a reception side filter chip are provided on different piezoelectric substrates, it is also possible to reduce the distorted signal generated in the transmission side filter by the capacitance element provided in the reception side filter. Note, in this case, it is necessary to consider the influence of resistance etc. of the connecting interconnects for connecting the two. Therefore, as shown in the embodiments, preferably the IDT and the capacitance element are provided on the same substrate.

Note that, formulas (1) to (3) and (9) to (19) are formulas which are satisfied in the ideal case. In actuality, according to manufacturing variations of comb-shaped electrodes, variations of piezoelectric substrates, measurement error, etc., they sometimes deviate within a short range. Even in that case, by adjusting the $D_j$ and $W_j$ of the capacitance elements along the gist of the present invention, the influence of the distorted wave can be suppressed. For example, when considering the above manufacturing variations in formula (14) as well, so long as the following formula (24) is satisfied, the power of the signal generated due to the secondary distortion can be reduced by about 10 dB, therefore the effect of lowering distortion sufficiently for practical use is obtained.

$$\sum_{j=1}^{m} \frac{W_j}{D_j^2} - \sum_{i=1}^{n} \frac{w_i}{d_i^2} \leq (0.33) \sum_{i=1}^{n} \frac{w_i}{d_i^2} \quad (24)$$

REFERENCE SIGNS LIST

51 . . . SAW element (acoustic wave element), 53 . . . piezoelectric substrate, 53a . . . upper surface, 55 . . . IDT, 59A . . . first comb-shaped electrode, 59B . . . second comb-shaped electrode, 61A . . . first bus bar, 61B . . . second bus bar, 63A . . . first electrode finger, 63B . . . second electrode finger, 67A . . . first gap, 67B . . . second gap, 69 . . . capacitance element, 71A . . . first counter electrode, and 71B . . . second counter electrode.

The invention claimed is:

1. An acoustic wave element comprising:
a piezoelectric substrate,
an IDT comprising a first comb-shaped electrode and a second comb-shaped electrode which are located on an upper surface of the piezoelectric substrate, and
a single capacitance element which is located on the upper surface of the piezoelectric substrate and is electrically connected to the IDT, wherein
the first comb-shaped electrode comprises
a first bus bar and
a plurality of first electrode fingers extending from the first bus bar,
the second comb-shaped electrode comprises
a second bus bar and
a plurality of second electrode fingers extending from the second bus bar,
in the first comb-shaped electrode and the second comb-shaped electrode, the plurality of first electrode fingers and the plurality of second electrode fingers mesh with each other,
the first electrode fingers have tips facing the second comb-shaped electrode across first gaps in their extending direction,
the second electrode fingers have tips facing the first comb-shaped electrode across second gaps in their extending direction,
the capacitance element comprises
a first counter electrode which is connected to the first comb-shaped electrode and
a second counter electrode which is connected to the second comb-shaped electrode and faces the first counter electrode across a third gap,
the direction from the first counter electrode through the third gap toward the second counter electrode is a reverse direction from the direction from the first comb-shaped electrode through the first gaps toward the second comb-shaped electrode and from the direction from the first comb-shaped electrode through the second gaps toward the second comb-shaped electrode, with respect to a crystal orientation, and
a length D and width L of the third gap satisfy the following formula (A) where the total number of the first gaps and the second gaps is n where n≥2, and lengths and widths of the i-th first gap and second gap among the first gaps and the second gaps which are counted in order from one end of the IDT are di and wi where 1≥i≥n:

$$0 < \frac{L}{D^2} < 2\sum_{i=1}^{n} \frac{w_i}{d_i^2}. \quad (A)$$

2. The acoustic wave element as set forth in claim 1, wherein the gap length D and width L of the third gap satisfy the following formula (B):

$$0.45\sum_{i=1}^{n} \frac{w_i}{d_i^2} < \frac{L}{D^2} < 1.45\sum_{i=1}^{n} \frac{w_i}{d_i^2}. \quad (B)$$

3. The acoustic wave element as set forth in claim 2, wherein the gap length D and width L of the third gap satisfy the following formula (C):

$$\frac{L}{D^2} = \sum_{i=1}^{n} \frac{w_i}{d_i^2}. \quad (c)$$

4. The acoustic wave element as set forth in any one of claims 1 to 3, wherein:
the first comb-shaped electrode further comprises a plurality of first dummy electrodes which extend from the first bus bar to the second bus bar side among the plurality of first electrode fingers and which have tips which face the tips of the plurality of second electrode fingers across the second gaps, and
the second comb-shaped electrode further comprises a plurality of second dummy electrodes which extend from the second bus bar to the first bus bar side among the plurality of second electrode fingers and which have tips which face the tips of the first electrode fingers across the first gaps.

5. The acoustic wave element as set forth in any one of claims 1 to 4,
wherein the first bus bar and the first counter electrode are made integral.

6. An acoustic wave element comprising:
a piezoelectric substrate,
an IDT comprising a first comb-shaped electrode and a second comb-shaped electrode which are located on an upper surface of the piezoelectric substrate, and
two or more capacitance elements which are located on the upper surface of the piezoelectric substrate and are electrically connected to the IDT, wherein
the first comb-shaped electrode comprises
a first bus bar and
a plurality of first electrode fingers extending from the first bus bar,
the second comb-shaped electrode comprises
a second bus bar and
a plurality of second electrode fingers extending from the second bus bar,
in the first comb-shaped electrode and the second comb-shaped electrode, the plurality of first electrode fingers and the plurality of second electrode fingers mesh with each other,
the first electrode fingers have tips facing the second comb-shaped electrode across first gaps in their extending direction,
the second electrode fingers have tips facing the first comb-shaped electrode across second gaps in their extending direction,
the capacitance elements comprises
two or more first counter electrodes which are connected to the first comb-shaped electrode and
two or more second counter electrodes which are connected to the second comb-shaped electrode and face the first counter electrodes across third gaps,
the direction from the first counter electrodes through the third gaps toward the second counter electrodes is a reverse direction from the direction from the first comb-shaped electrode through the first gaps toward the second comb-shaped electrode and from the direction from the first comb-shaped electrode through the second gaps toward the second comb-shaped electrode with respect to a crystal orientation, and the capacitance elements satisfy the following formula (D) where the total number of the first gaps and the second gaps is n where n≥2, lengths and widths of the i-th first gap and second gap among the first gaps and the second gaps which are counted in order from one end of the IDT are di and wi where 1≤i≤n, the total number of the third gaps is m where m≥2, and the length and width of the j-th third gap are Dj and Wj where 1≤j≤m:

$$0 < \sum_{j=1}^{m} \frac{W_j}{D_j^2} < 2\sum_{i=1}^{n} \frac{w_i}{d_i^2}. \quad (D)$$

7. An acoustic wave element comprising:
a piezoelectric substrate,
an IDT provided comprising a first comb-shaped electrode and a second comb-shaped electrode which are located on an upper surface of the piezoelectric substrate, and
a pair of reflectors which are located on the upper surface of the piezoelectric substrate so as to sandwich the IDT therebetween, wherein
the first comb-shaped electrode comprises
a first bus bar and
a plurality of first electrode fingers extending from the first bus bar,
the second comb-shaped electrode comprises
a second bus bar and
a plurality of second electrode fingers extending from the second bus bar,
in the first comb-shaped electrode and the second comb-shaped electrode, the plurality of first electrode fingers and the plurality of second electrode fingers mesh with each other,
the first electrode fingers have tips facing the second comb-shaped electrode across first gaps in their extending direction,
the second electrode fingers have tips facing the first comb-shaped electrode across second gaps in their extending direction,
the reflectors comprise
first counter electrodes which are connected to the first comb-shaped electrode and
second counter electrodes which are connected to the second comb-shaped electrode and face the first counter electrodes, one electrode of the first counter electrodes and the second counter electrodes comprises a plurality of third electrode fingers which extend toward the other electrodes of the first counter electrodes and the second counter electrodes and have tips facing the other electrodes across the third gaps in their extending direction, and the direction from the first counter electrodes across the third gaps toward the second counter electrodes is a reverse direction from the direction from the first comb-shaped electrode through the first gaps toward the second comb-shaped electrode and from the direction from the first comb-shaped electrode through the second gaps toward the second comb-shaped electrode with respect to a crystal orientation.

8. The acoustic wave element as set forth in claim 7, wherein:

the reflectors satisfy the following formula (D) where
the total number of the first gaps and the second gaps is where n≥2, the lengths and widths of the i-th first gap and second gap among the first gaps and the second gaps which are counted in order from one end of the IDT are di and wi where 1≤i≤n, the total number of the third gaps is m where m≥2, and the length and width of the j-th third gap are Dj and Wj where 1≤j≤m:

$$0 < \sum_{j=1}^{m} \frac{W_j}{D_j^2} < 2\sum_{i=1}^{n} \frac{w_i}{d_i^2}. \quad (D)$$

9. The acoustic wave element as set forth in claim 7 or 8, wherein:

the third gaps are located in a region which is out of the extension region obtained by extending the crossing region of the first electrode fingers and the second electrode fingers along the propagation direction of the acoustic wave.

10. A branching filter comprising:
an antenna terminal,
a transmitting filter which filters transmission signals and outputs the result to the antenna, and
a receiving filter which filters a reception signal from the antenna, wherein
the transmitting filter comprises the acoustic wave element as set forth in any one of claims 1 to 9.

11. A communication module comprising:
an antenna,
the branching filter as set forth in claim 10 which is electrically connected to the antenna, and
an RF-IC which is electrically connected to the branching filter.

* * * * *